(12) United States Patent
Chakihara et al.

(10) Patent No.: US 9,543,315 B1
(45) Date of Patent: Jan. 10, 2017

(54) SEMICONDUCTOR DEVICE

(71) Applicant: Renesas Electronics Corporation, Tokyo (JP)

(72) Inventors: Hiraku Chakihara, Tokyo (JP); Satoshi Abe, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/212,331

(22) Filed: Jul. 18, 2016

(30) Foreign Application Priority Data

Aug. 11, 2015 (JP) ................. 2015-158890

(51) Int. Cl.
*H01L 29/78* (2006.01)
*H01L 27/115* (2006.01)
*H01L 49/02* (2006.01)

(52) U.S. Cl.
CPC ......... *H01L 27/11573* (2013.01); *H01L 28/40* (2013.01); *H01L 29/78* (2013.01)

(58) Field of Classification Search
CPC ..... H01L 29/78; H01L 28/40; H01L 27/11573
See application file for complete search history.

(56) References Cited

U.S. PATENT DOCUMENTS

| 7,872,907 | B2 * | 1/2011 | Okayama | G11C 5/025 365/158 |
| 8,084,800 | B2 * | 12/2011 | Kawashima | H01L 27/0629 257/296 |
| 8,189,369 | B2 * | 5/2012 | Okayama | G11C 5/025 365/158 |
| 8,199,550 | B2 * | 6/2012 | Okayama | G11C 5/025 365/158 |
| 8,391,041 | B2 * | 3/2013 | Okayama | G11C 5/025 365/158 |
| 8,508,986 | B2 * | 8/2013 | Tanizaki | G11C 11/1653 365/158 |
| 8,681,527 | B2 * | 3/2014 | Obayashi | G11C 17/18 257/529 |

(Continued)

FOREIGN PATENT DOCUMENTS

| JP | 2009-099640 A | 5/2009 |
| JP | 2014-229844 A | 12/2014 |

*Primary Examiner* — Nicholas Tobergte
(74) *Attorney, Agent, or Firm* — Sughrue Mion, PLLC

(57) ABSTRACT

The memory cell includes a gate insulating film, a control gate electrode, a cap insulating film, a cap layer, another gate insulating film, and a memory gate electrode. A laminated capacitive element includes a capacitive electrode which is constituted by a sub-electrode and another sub-electrode formed of mesa portions (protruding portions) disposed on the sub-electrode at a predetermined interval and each having an upper surface and side surfaces, a capacitive insulating film which is formed along an upper surface of the sub-electrode and the upper surface and the side surfaces of the another sub-electrode, and another capacitive electrode which is formed on the capacitive insulating film. Further, the control gate electrode and the sub-electrode are made of a conductor film, the cap layer and the another sub-electrode are made of other conductor film, and the memory gate electrode and the another capacitive electrode are made of another conductor film.

15 Claims, 25 Drawing Sheets

(56) References Cited

U.S. PATENT DOCUMENTS

| | | | |
|---|---|---|---|
| 8,846,471 B2* | 9/2014 | Mihara | G11C 11/5671 |
| | | | 257/E21.691 |
| 9,214,350 B2* | 12/2015 | Ishii | H01L 29/42344 |
| 9,324,726 B2* | 4/2016 | Kawashima | H01L 27/11529 |
| 2009/0095995 A1 | 4/2009 | Kawashima et al. | |
| 2014/0346581 A1 | 11/2014 | Ishii et al. | |

\* cited by examiner

SEMICONDUCTOR DEVICE

CROSS-REFERENCE TO RELATED APPLICATION

The present application claims priority from Japanese Patent Application No. 2015-158890 filed on Aug. 11, 2015, the content of which is hereby incorporated by reference into this application.

TECHNICAL FIELD OF THE INVENTION

The present invention relates to a semiconductor device and is preferably applicable, for example, to a semiconductor device which includes a non-volatile memory cell.

BACKGROUND OF THE INVENTION

A semiconductor device which includes a memory cell region in which a memory cell, for example, a non-volatile memory or the like, is formed on a semiconductor substrate, and a peripheral circuit region in which a peripheral circuit constituted by, for example, a metal insulator semiconductor field effect transistor (MISFET) or the like, is formed on the semiconductor substrate, has been widely used.

For example, a memory cell constituted by a split gate cell made of a metal-oxide-nitride-oxide-semiconductor (MONOS) film is sometimes formed as the non-volatile memory. This memory cell is formed using two MISFET's including a control transistor which has a control gate electrode, and a memory transistor which has a memory gate electrode. In addition, a gate insulating film of the memory transistor is made up of a laminate film which includes, for example, a silicon oxide film, a silicon nitride film, and a silicon oxide film and is referred to as an oxide nitride oxide (ONO) film.

Further, a voltage higher than a power supply voltage which is supplied from the outside of the semiconductor device is required for an electrical write or erase operation with respect to the non-volatile memory, and thus, a booster circuit which includes a capacitive element is formed in a peripheral circuit region of the semiconductor device. In addition, a bypass capacitor (capacitive element) which is connected between a power supply wire (Vcc) and a ground wire (Gnd) of the semiconductor device in order for stabilization of power supply is also built in the semiconductor device. A polysilicon insulator polysilicon (PIP) capacitive element which has a favorable consistency with a manufacturing process of the memory cell is used as these capacitive elements.

Japanese Patent Application Laid-Open Publication No. 2009-99640 (Patent Document 1) discloses a non-volatile memory cell which includes a control gate electrode (corresponding to the above-described control gate electrode) 15, a memory gate electrode 26, and a laminate film (corresponding to the above-described ONO film) provided between the control gate electrode 15 and a semiconductor substrate 10, and the memory gate electrode 26. In addition, a capacitive element constituted by a lower electrode 16, a capacitor insulating film 27, and an upper electrode 23 is also disclosed. Further, a method is disclosed in which the control gate electrode 15 of the memory cell and the lower electrode 16 of the capacitive element are formed of a polysilicon film 14, the memory gate electrode 26 of the memory cell and the upper electrode 23 of the capacitive element are formed of a polysilicon film 20, and the capacitor insulating film 27 of the capacitive element is formed of the laminate film of the memory cell.

Japanese Patent Application Laid-Open Publication No. 2014-229844 (Patent Document 2) discloses a non-volatile memory cell which includes a control gate electrode (corresponding to the above-described control gate electrode) 15, a memory gate electrode 26, and an insulating film 27a. In addition, a capacitive element, which includes an electrode 16, a capacitive insulating film 27, and an electrode 23, is also disclosed. Further, a method is disclosed in which the control gate electrode 15 of the memory cell and the electrode 16 of the capacitive element are formed of a conductor film CF1, the memory gate electrode 26 of the memory cell and the electrode 23 of the capacitive element are formed of a conductor film CF2, and the capacitive insulating film 27 of the capacitive element is formed of the insulating film 27a of the memory cell. In addition, a structure is disclosed in which the electrode 23 is disposed on a sidewall of the electrode 16 via the capacitive insulating film 27.

SUMMARY OF THE INVENTION

A semiconductor device including a non-volatile memory cell which has been studied by the inventors of the present application includes the non-volatile memory cell constituted by a control gate electrode, an ONO film, and a memory gate electrode, in a memory cell region, and a plurality of MISFET's and a PIP capacitive element in a peripheral circuit region.

The number of elements such as the memory cell, the MISFET, and the PIP capacitive element has increased, and a size of the semiconductor device (semiconductor chip) has increased along with higher functionality of the semiconductor device. However, there is a demand for reduction in size of the semiconductor device (semiconductor chip) in order to respond to a request on reduction in size of a system (a personal computer, a mobile phone, or the like) incorporated in the semiconductor device, or, to reduce manufacturing cost of the semiconductor device (semiconductor chip).

The above and other preferred aims and novel characteristics of the present invention will be apparent from the description of the present specification and the accompanying drawings.

According to an embodiment, a semiconductor device includes a memory cell and a capacitive element. The memory cell includes a control gate electrode, a cap layer on the control gate electrode, and a memory gate electrode disposed adjacent to the control gate electrode. The capacitive element includes a first capacitive electrode which is constituted by a plate-shaped first sub-electrode and a plurality of mesa-like second sub-electrodes formed on the first sub-electrode via a first insulating film, and a second capacitive electrode formed on side surfaces of the neighboring second sub-electrodes via the second insulating film. Further, the control gate electrode and the first sub-electrode are made of a first conductor film, the cap layer and the second sub-electrode are made of a second conductor film, and the memory gate electrode and the second capacitive electrode are made of a third conductor film.

According to the embodiment, the reduction in size of the semiconductor device which is provided with the non-volatile memory is achieved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted. In addition, the description of the same or similar portions is not repeated in principle unless particularly required in the following embodiments.

In addition, in some drawings used in the embodiments, hatching may be omitted even in a cross-sectional view so as to make the drawings easy to see.

Further, in the following embodiments, a conductor piece and an insulator piece mean a part, a portion, or a section which is obtained by dividing a conductor film or an insulating film into one or a plurality of pieces through the photolithography technique, the etching technique, and the like. In addition, the conductor piece and the insulator piece include one which is selectively formed on a surface of a conductor by oxidation.

First Embodiment

Layout Configuration Example of Semiconductor Chip

Figure 1:
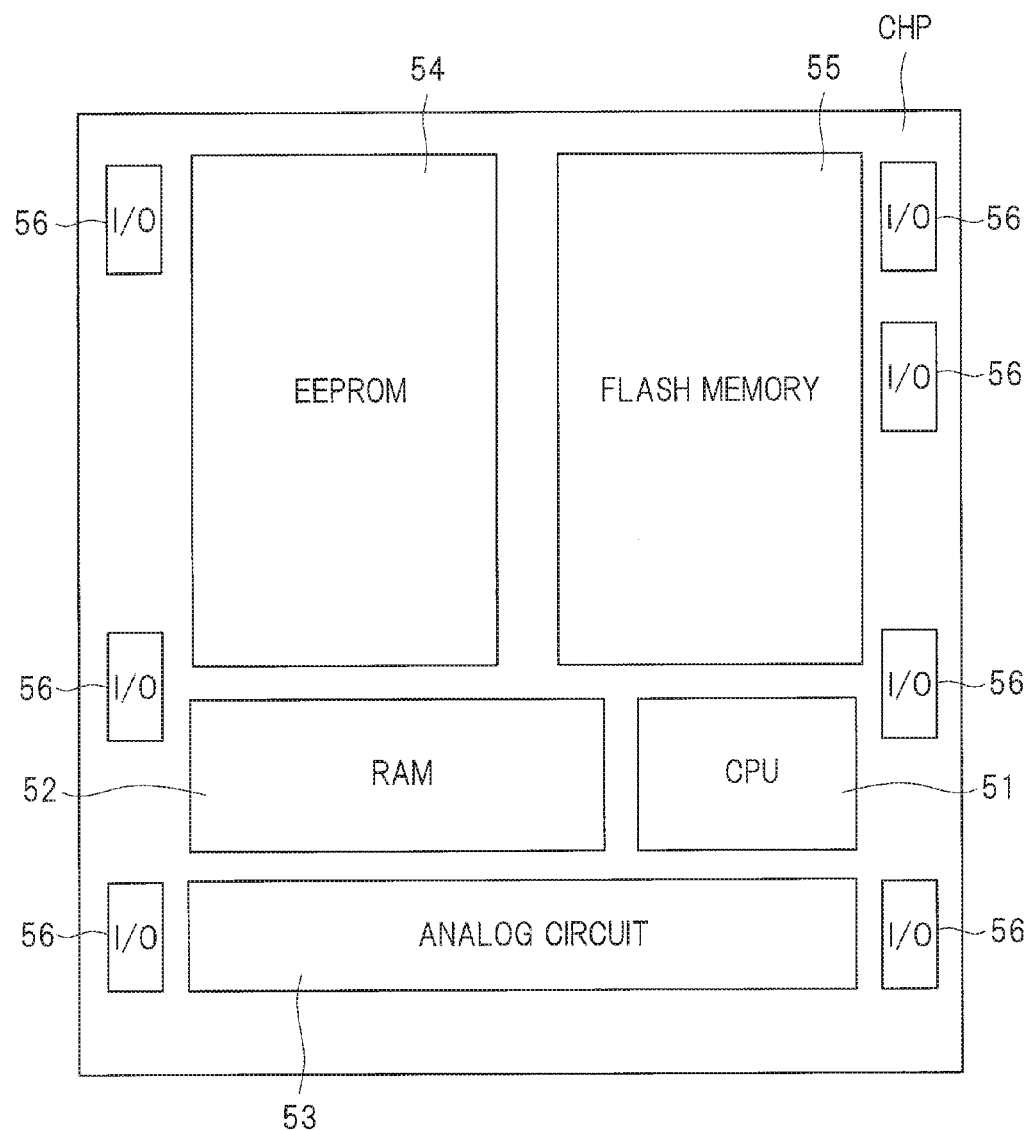
FIG. 1 is a diagram illustrating a layout configuration example of a semiconductor chip according to a first embodiment.

A semiconductor device including a non-volatile memory according to a first embodiment will be described with reference to the drawings. First, a layout configuration of the semiconductor device (semiconductor chip) in which a system including the non-volatile memory is formed will be described. FIG. 1 is a diagram illustrating a layout configuration example of a semiconductor chip CHP according to the first embodiment. In FIG. 1, the semiconductor chip CHP includes a central processing unit (CPU) 51, a random access memory (RAM) 52, an analog circuit 53, an electrically erasable programmable read only memory (EEPROM) 54, a flash memory 55, and an input/output (I/O) circuit 56 and constitutes a semiconductor integrated circuit device.

The CPU (circuit) 51 is also called a central processing unit and is configured to read and decode a command from a memory device to perform various types of calculations and controls based on the command.

The RAM (circuit) 52 is a memory which is capable of randomly reading memory information, that is, randomly reading the stored memory information, or newly writing the memory information and is also called a random readable and writable memory. There are two types of the RAMs as an IC memory, that is, a dynamic RAM (DRAM) using a dynamic circuit and a static RAM (SRAM) using a static circuit. The DRAM is a random readable and writable memory which requires a memory holding operation, and the SRAM is a random readable and writable memory which does not require the memory holding operation.

The analog circuit 53 is a circuit that handles a signal of voltage or current that continuously changes temporally, that is, an analog signal, and is constituted by, for example, an amplifier circuit, a converter circuit, a modulator circuit, an oscillator circuit, a power supply circuit, and the like. Further, the analog circuit 53 includes a plurality of capacitive elements.

Each of the EEPROM 54 and the flash memory 55 is one type of a non-volatile memory which is electrically rewritable in a write operation and an erase operation and is also called an electrically erasable programmable read only memory. Each memory cell of the EEPROM 54 and the flash memory 55 is constituted by, for example, a MONOS transistor or a metal nitride oxide semiconductor (MNOS) transistor for storage (memory). For example, a Fowler-Nordheim tunneling phenomenon is utilized for the write operation and the erase operation of the EEPROM 54 and the flash memory 55. Note that it is also possible to use a hot electron or a hot hole to perform the write operation or the erase operation. A voltage higher than an external power supply voltage is required for the write operation and the erase operation of the EEPROM 54 and the flash memory 55, and thus, the EEPROM 54 and the flash memory 55 include a booster circuit and the like, and the booster circuit includes a plurality of capacitive elements. A difference between the EEPROM 54 and the flash memory 55 is that the EEPROM 54 is a non-volatile memory in which the erase can be performed, for example, in unit of byte, while the flash memory 55 is a non-volatile memory in which the erase can be performed, for example, in unit of word line. In general, a program configured to cause the CPU 51 to execute various types of processes is stored in the flash memory 55. In contrast, various types of data with high rewriting frequency are stored in the EEPROM 54.

The I/O circuit 56 is an input and output circuit and is a circuit configured to perform output of data from the inside of the semiconductor chip CHP to a device connected to the outside of the semiconductor chip CHP and input of data from the device connected to the outside of the semiconductor chip CHP into the semiconductor chip. In addition, a bypass capacitor (capacitive element) which is connected between a power supply wire (Vcc) and a ground wire (Gnd) of the semiconductor chip CHP is also disposed in the I/O circuit 56.

A plurality of memory cells serving as the non-volatile memory are disposed in a matrix form in the EEPROM 54 and the flash memory 55. Further, the CPU 51, the RAM 52, the analog circuit 53, the I/O circuit 56, and parts other than the memory cells of the EEPROM 54 and the flash memory 55 are formed using a high breakdown voltage MISFET and/or a low breakdown voltage MISFET. The high breakdown voltage MISFET and the low breakdown voltage MISFET are constituted by an n-type MISFET and a p-type MISFET, respectively.

<Structure of Semiconductor Device>

Figure 2:
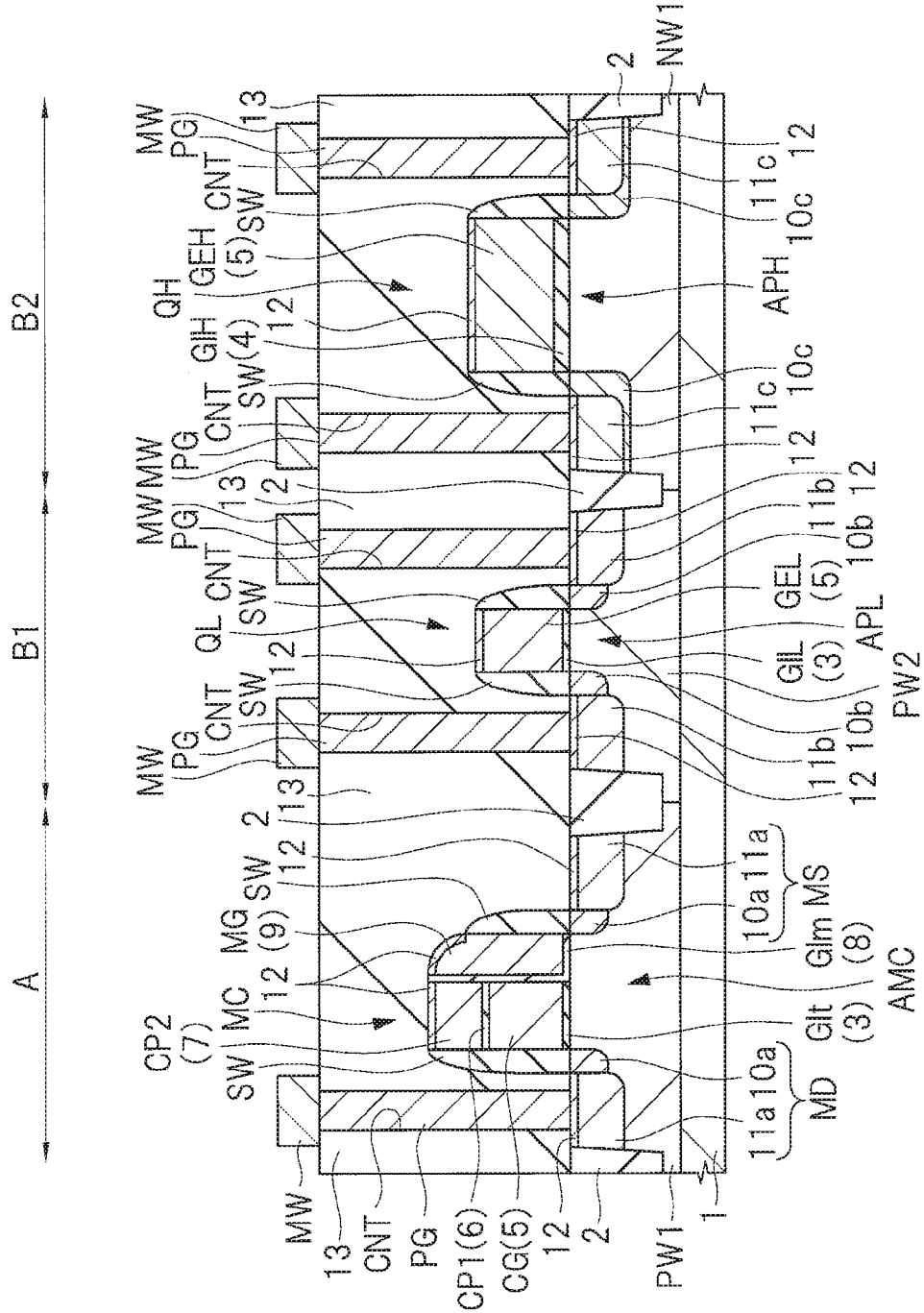
FIG. 2 is a cross-sectional view illustrating an essential part of a semiconductor device of the first embodiment.
Figure 3:
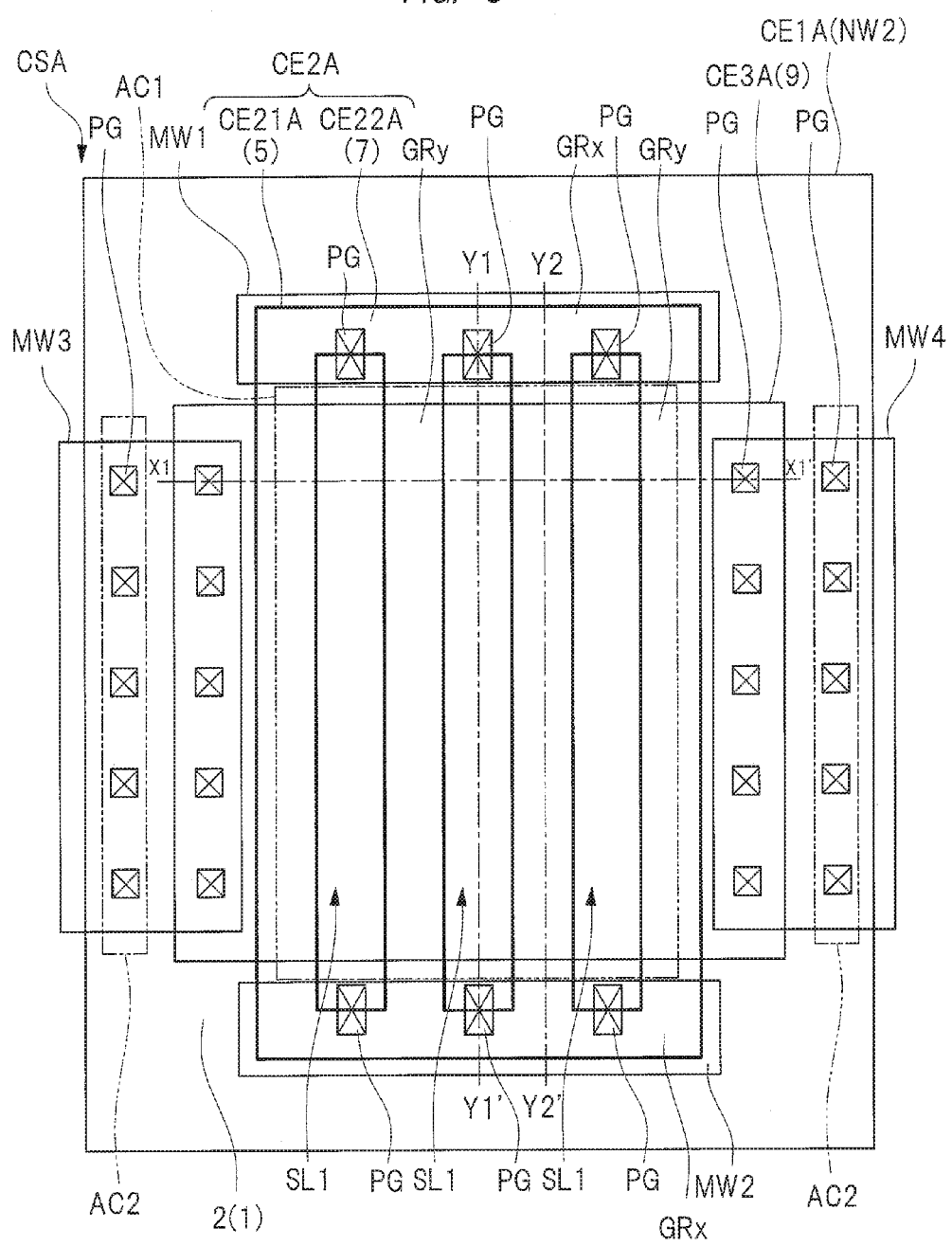
FIG. 3 is a plan view illustrating an essential part of a laminated capacitive element of the first embodiment.
Figure 4:
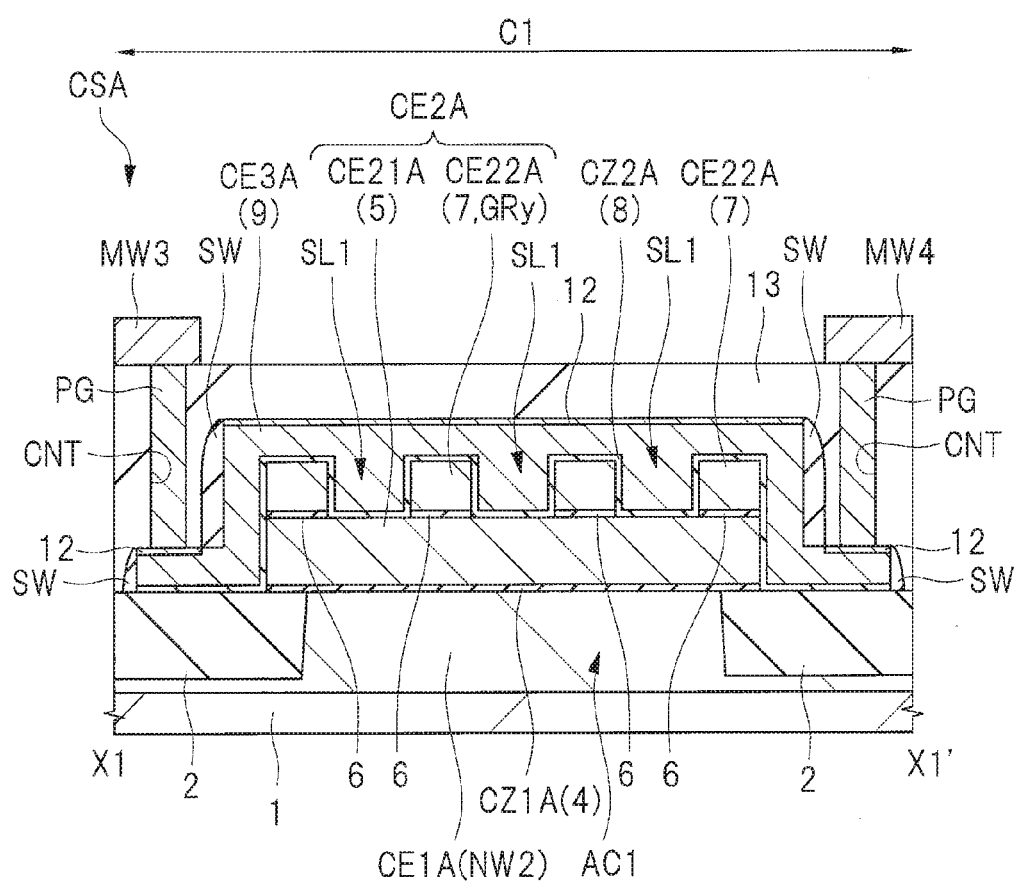
FIG. 4 is a cross-sectional view illustrating an essential part taken along a line X1-X1' of FIG. 3.
Figure 5:
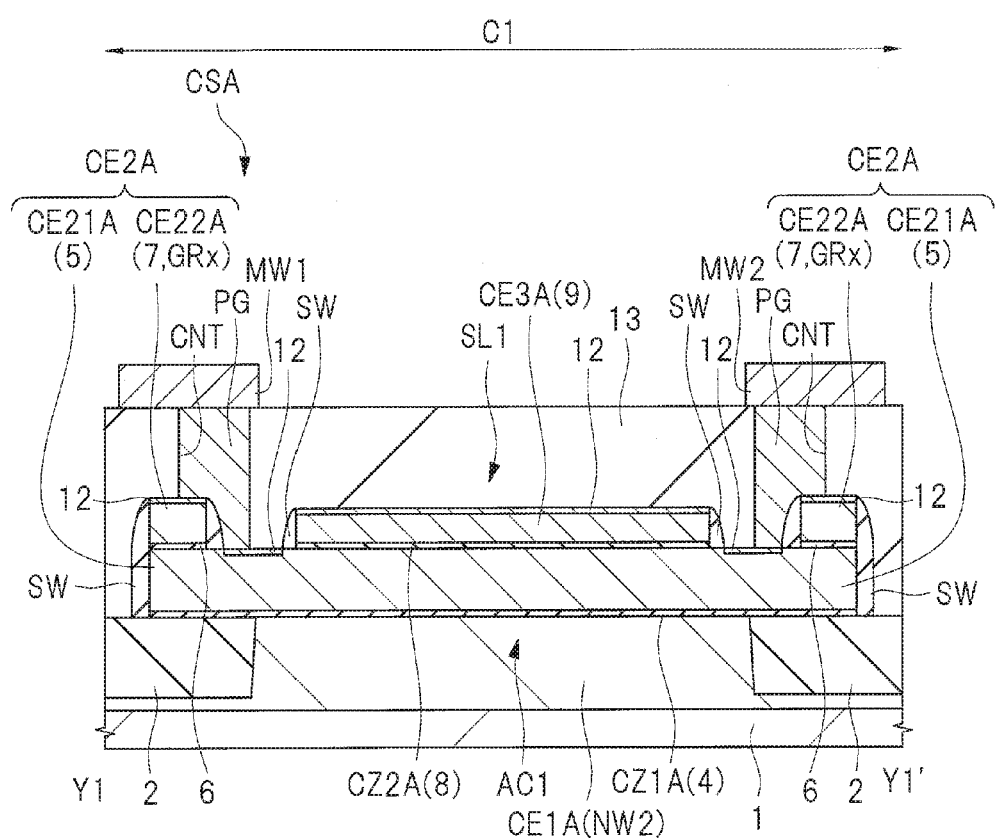
FIG. 5 is a cross-sectional view illustrating an essential part taken along a line Y1-Y1' of FIG. 3.
Figure 6:
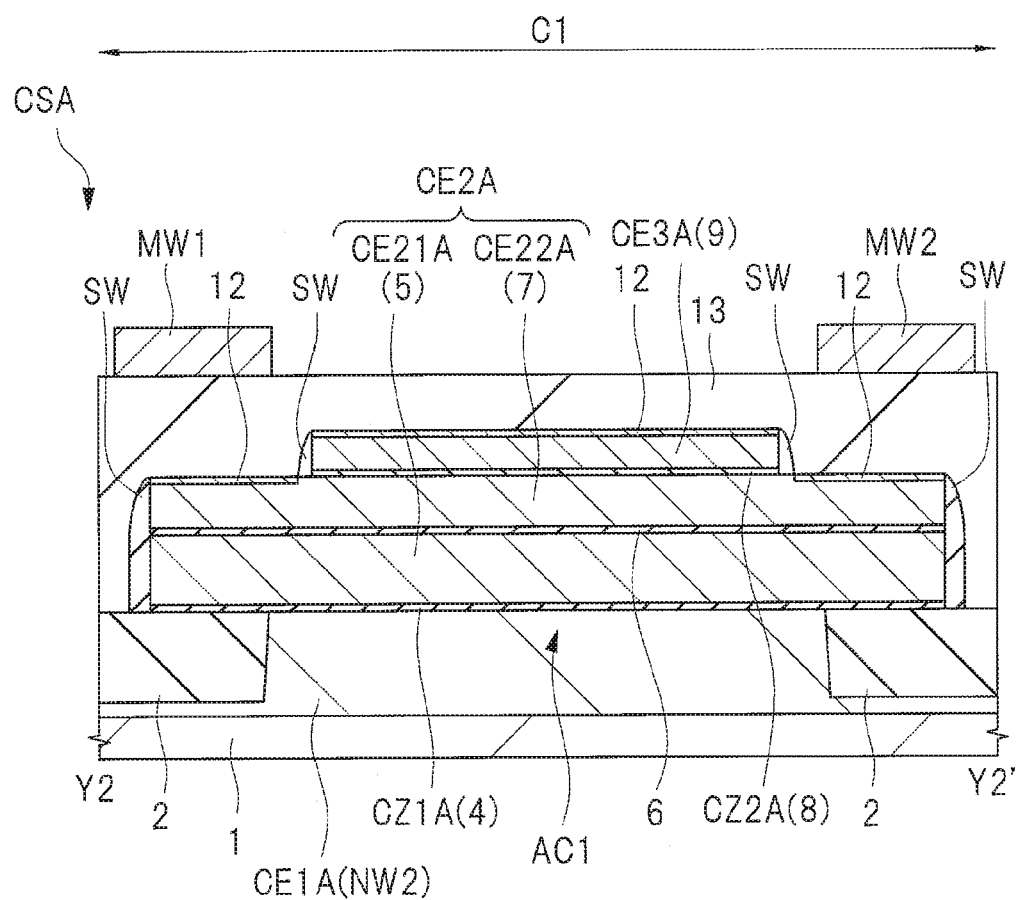
FIG. 6 is a cross-sectional view illustrating an essential part taken along a line Y2-Y2' of FIG. 3.

FIG. 2 is a cross-sectional view illustrating an essential part of the semiconductor device of the first embodiment. FIG. 3 is a plan view illustrating an essential part of a laminated capacitive element of the first embodiment, FIG. 4 is a cross-sectional view illustrating an essential part taken along a line X1-X1' of FIG. 3, FIG. 5 is a cross-sectional view illustrating an essential part taken along a line Y1-Y1' of FIG. 3, and FIG. 6 is a cross-sectional view illustrating an essential part taken along a line Y2-Y2' of FIG. 3.

As illustrated in FIG. 2, the semiconductor device includes a semiconductor substrate 1. The semiconductor substrate 1 is a semiconductor wafer which is made of, for example, p-type monocrystalline silicon having a specific resistance of about 1 to 10 Ωcm.

The semiconductor device includes a memory cell region A and peripheral circuit regions B1 and B2 as some regions of the main surface of the semiconductor substrate 1. A memory cell MC is formed in the memory cell region A, an n-channel low breakdown voltage MISFET QL is formed in the peripheral circuit region B1, a p-channel high breakdown voltage MISFET QH is formed in the peripheral circuit region B2, and a laminated capacitive element CSA is formed in a peripheral circuit region C1 which will be described later. The memory cell region A corresponds to the EEPROM 54 or the flash memory 55 of FIG. 1.

First, a configuration of the memory cell MC formed in the memory cell region A will be described in detail.

The semiconductor device includes an active region AMC and an element isolation region (element isolation film) 2 in the memory cell region A. The element isolation region 2 is configured to isolate elements formed in the active region AMC, and an element isolation insulating film is provided in the element isolation region 2. The active region AMC is defined, that is, partitioned by the element isolation region 2 and is electrically isolated from other active regions by the element isolation region 2, and a p-type well PW1 is formed in the active region AMC. The p-type well PW1 is a semiconductor region which is of a p-type conductivity type.

As illustrated in FIG. 2, the memory cell MC constituted by a memory transistor and a control transistor is formed in the p-type well PW1 of the memory cell region A. In practice, a plurality of memory cells MC are formed in an array in the memory cell region A, and FIG. 2 illustrates a cross-section of the single memory cell MC thereof.

The memory cell MC is a split gate memory cell. That is, the memory cell MC includes the control transistor which has a control gate electrode CG, and the memory transistor which is connected to the control transistor and has a memory gate electrode MG as illustrated in FIG. 2.

As illustrated in FIG. 2, the memory cell MC includes an n-type semiconductor region MS, an n-type semiconductor region MD, the control gate electrode CG, and the memory gate electrode MG. Each of the n-type semiconductor region MS and the n-type semiconductor region MD is of an n-type conductivity type which is of a conductivity type opposite to the p-type conductivity type. In addition, the memory cell MC includes a cap insulating film CP1 formed on the control gate electrode CG and a cap layer CP2 formed on the cap insulating film CP1. Further, the memory cell MC includes a gate insulating film GIt which is formed between the control gate electrode CG and the p-type well PW1 of the semiconductor substrate 1, and a gate insulating film GIm which is formed between the memory gate electrode MG and the p-type well PW1 of the semiconductor substrate 1 and between the memory gate electrode MG and the control gate electrode CG.

The control gate electrode CG and the memory gate electrode MG extend along the main surface of the semiconductor substrate 1 and are disposed side by side in a state in which the gate insulating film GIm is interposed between side surfaces thereof opposing each other, that is, between sidewalls thereof. Each extending direction of the control gate electrode CG and the memory gate electrode MG is a direction perpendicular to the paper plane of FIG. 2. The control gate electrode CG is formed on a part of the p-type well PW1 positioned between the semiconductor region MD and the semiconductor region MS, that is, on the main surface of the semiconductor substrate 1 via the gate insulating film GIt. In addition, the memory gate electrode MG is formed on a part of the p-type well PW1 positioned between the semiconductor region MD and the semiconductor region MS, that is, on the main surface of the semiconductor substrate 1 via the gate insulating film GIm. In addition, the memory gate electrode MG is disposed on the semiconductor region MS side, and the control gate electrode CG is disposed on the semiconductor region MD side. The control gate electrode CG and the memory gate electrode MG are gate electrodes to form the memory cell MC, that is, the non-volatile memory.

Note that the cap insulating film CP1 and the cap layer CP2 which are formed on the control gate electrode CG also extend along the main surface of the semiconductor substrate 1 in the direction perpendicular to the paper plane of FIG. 2.

The control gate electrode CG and the memory gate electrode MG are adjacent to each other with the gate insulating film GIm interposed therebetween, and the memory gate electrode MG is formed like a sidewall spacer on the side surface of the control gate electrode CG, that is, on the sidewall via the gate insulating film GIm. In addition, the gate insulating film GIm extends across both regions including a region between the memory gate electrode MG and the p-type well PW1 of the semiconductor substrate 1, and a region between the memory gate electrode MG and the control gate electrode CG. However, the insulating film GIm between the memory gate electrode MG and the control gate electrode CG may be formed to have a different film quality through a different process from the gate insulating film GIm between the memory gate electrode MG and the p-type well PW1 of the semiconductor substrate 1.

The gate insulating film GIt is made of an insulating film 3. The insulating film 3 is made of a silicon oxide film, a silicon nitride film or a silicon oxynitride film, or a high dielectric constant film, that is, a so-called High-k film which has a higher relative dielectric constant than the silicon nitride film. Note that, when the expression of the High-k film or the high dielectric constant film is used in the present application, it indicates a film which has a higher dielectric constant (relative dielectric constant) than the silicon nitride film. For example, a metal oxide film such as a hafnium oxide film, a zirconium oxide film, an aluminum oxide film, a tantalum oxide film, and a lanthanum oxide film can be used as the insulating film 3.

The gate insulating film GIm is made of an insulating film 8. The insulating film 8 is made of a laminate film which includes a silicon oxide film, a silicon nitride film formed on the silicon oxide film and serving as a charge storage unit, and a silicon oxide film on the silicon nitride film, and is called an ONO film. Note that the gate insulating film GIm between the memory gate electrode MG and the p-type well PW1 functions as the gate insulating film of the memory transistor as described above. In contrast, the gate insulating film GIm between the memory gate electrode MG and the control gate electrode CG functions as an insulating film configured to insulate, that is, electrically isolate between the memory gate electrode MG and the control gate electrode CG.

The silicon nitride film of the insulating film 8 is an insulating film configured to store a charge, and functions as the charge storage unit. That is, the silicon nitride film is a trapping insulating film which is formed in the insulating film 8. Thus, the insulating film 8 can be considered as the insulating film which includes the charge storage unit therein.

The silicon oxide films which are positioned on and under the silicon nitride film can function as a charge blocking layer to confine the charges. That is, when the silicon nitride film has a structure of being interposed between the upper and lower silicon oxide films, the leakage of the charges stored in the silicon nitride film is prevented.

The control gate electrode CG is made of a conductor film (a conductive film, a conductor layer, or a conductive layer) 5. The conductor film 5 is made of silicon and, for example, is made of an n-type polysilicon film which is a polycrystalline silicon film into which an n-type impurity is doped. To be specific, the control gate electrode CG is made of the patterned conductor film 5.

The memory gate electrode MG is made of a conductor film (a conductive film, a conductor layer, or a conductive layer) 9. The conductor film 9 is made of silicon, and, for example, is made of an n-type polysilicon film which is a polycrystalline silicon film into which an n-type impurity is doped. The memory gate electrode MG is formed like the sidewall spacer on the sidewall, which is positioned on a first side of the control gate electrode CG adjacent to the memory gate electrode MG, via the insulating film 8.

The cap layer CP2 is formed on the control gate electrode CG via the cap insulating film CP1. Thus, the memory gate electrode MG is formed like the sidewall spacer on the sidewall which is positioned on a first side of the cap layer CP2 formed on the control gate electrode CG adjacent to the memory gate electrode MG, via the insulating film 8.

The cap insulating film CP1 is made of an insulating film 6 which is made of, for example, a silicon oxide film or the like. In addition, the cap layer CP2 is made of a conductor film (a conductive film, a conductor layer, or a conductive layer) 7. The conductor film 7 is made of a silicon film or the like and, for example, is made of an n-type polysilicon film which is a polycrystalline silicon film into which an n-type impurity is doped.

The cap layer CP2 is a protection film that protects the control gate electrode CG, and can be used also as a hard mask film at the time of patterning the conductor film 5 to form the control gate electrode CG. In addition, the cap layer CP2 is a spacer film configured to adjust (secure) a height of the memory gate electrode MG at the time of etching the conductor film 9 to form the memory gate electrode MG. When the cap layer CP2 is formed as the spacer film, it is possible to set a film thickness of the control gate electrode CG to be equal to or smaller than the height of the memory gate electrode MG. It is possible to make the film thickness of the control gate electrode CG thin without being affected by the height of the memory gate electrode MG.

The semiconductor region MS is a semiconductor region which functions as either one of a source region or a drain region, and the semiconductor region MD is a semiconductor region which functions as the other of the source region or the drain region. Herein, the semiconductor region MS is the semiconductor region which functions as, for example, the source region, and the semiconductor region MD is the semiconductor region which functions as, for example, the drain region. Each of the semiconductor region MS and the semiconductor region MD is constituted by a semiconductor region into which the n-type impurity is doped and has a lightly doped drain (LDD) structure.

The semiconductor region MS for the source includes an $n^-$ semiconductor region 10a and an $n^+$ semiconductor region 11a which has a higher impurity concentration than the $n^-$ semiconductor region 10a. In addition, the semiconductor region MD for the drain includes the $n^-$ semiconductor region 10a and the $n^+$ semiconductor region 11a which has a higher impurity concentration than the $n^-$ semiconductor region 10a. The $n^+$ semiconductor region 11a has a deeper junction depth and the higher impurity concentration than the $n^-$ semiconductor region 10a.

Sidewall spacers (sidewall insulating films) SW which are made of an insulating film such as a silicon oxide film, a silicon nitride film, or a laminate film thereof are formed on a sidewall on the drain region side of the control gate electrode CG and a sidewall on the source region side of the memory gate electrode MG.

The $n^-$ semiconductor region 10a constituting the semiconductor region MS for the source is formed in a self-aligned manner with respect to a side surface of the memory gate electrode MG, and the $n^+$ semiconductor region 11a thereof is formed in a self-aligned manner with respect to a side surface of the sidewall spacer SW. Thus, the $n^-$ semiconductor region 10a having the low concentration is formed under the sidewall spacer SW on the sidewall of the memory gate electrode MG, and the $n^+$ semiconductor region 11a having the high concentration is formed on an outer side of the $n^-$ semiconductor region 10a having the low concentration.

The $n^-$ semiconductor region 10a constituting the semiconductor region MD for the drain is formed in a self-aligned manner with respect to the side surface of the control gate electrode CG, and the $n^+$ semiconductor region 11a thereof is formed in a self-aligned manner with respect to the side surface of the sidewall spacer SW. Thus, the $n^-$ semiconductor region 10a having the low concentration is formed under the sidewall spacer SW on the sidewall of the control gate electrode CG, and the $n^+$ semiconductor region 11a having the high concentration is formed on the outer side of the $n^-$ semiconductor region 10a having the low concentration. Accordingly, the $n^-$ semiconductor region 10a having the low concentration is formed to be adjacent to the p-type well PW1 serving as a channel region of the control transistor.

A channel region of the memory transistor is formed under the gate insulating film GIm under the memory gate electrode MG, and the channel region of the control transistor is formed under the gate insulating film GIt under the control gate electrode CG.

A metal silicide layer (silicide layer) 12 is formed on the $n^+$ semiconductor region 11a, that is, on an upper surface of the $n^+$ semiconductor region 11a through the Self-Aligned Silicide (Salicide) technique or the like. The metal silicide layer 12 is made of, for example, a cobalt silicide layer, a nickel silicide layer, or a platinum-added nickel silicide layer. It is possible to lower a diffusion resistance and a contact resistance using the metal silicide layer 12. Note that the metal silicide layer 12 is formed also on the memory gate electrode MG and the cap layer CP2.

Next, a configuration of the p-channel high breakdown voltage MISFET QH which is formed in the peripheral circuit region B2 will be described in detail.

The semiconductor device includes an active region APH and the element isolation region 2 in the peripheral circuit region B2. The structure and function of the element isolation region 2 are the same as described above. The active region APH is defined, that is, partitioned by the element isolation region 2, and is electrically isolated from other active regions by the element isolation region 2, and an n-type well NW1 is formed in the active region APH. That is, the active region APH is a region in which the n-type well NW1 is formed. The n-type well NW1 is a semiconductor region which is of the n-type conductivity type.

As illustrated in FIG. 2, the high breakdown voltage MISFET QH includes a semiconductor region which is constituted by a $p^-$ semiconductor region 10c and a $p^+$ semiconductor region 11c, a gate insulating film GIH which is formed on the n-type well NW1, and a gate electrode GEH which is formed on the gate insulating film GIH. The $p^-$ semiconductor region 10c and the $p^+$ semiconductor region 11c are formed on an upper layer portion of the n-type well NW1 of the semiconductor substrate 1. Each of the $p^-$ semiconductor region 10c and the $p^+$ semiconductor region 11c is of the p-type conductivity type which is of the conductivity type opposite to the n-type conductivity type.

The gate insulating film GIH functions as a gate insulating film of the MISFET QH. The gate insulating film GIH is made of an insulating film 4. The insulating film 4 is made of a silicon oxide film, a silicon nitride film or a silicon oxynitride film, or a high dielectric constant film, that is, a so-called High-k film which has the higher relative dielectric constant than the silicon nitride film. For example, a metal oxide film such as a hafnium oxide film, a zirconium oxide film, an aluminum oxide film, a tantalum oxide film, and a lanthanum oxide film can be used as the insulating film 4 made of the High-k film.

The gate electrode GEH is made of the conductor film 5. The conductor film 5 is made of, for example, a p-type polysilicon film which is a polycrystalline silicon film into which a p-type impurity is doped.

The semiconductor region constituted by the $p^-$ semiconductor region 10c and the $p^+$ semiconductor region 11c is a semiconductor region for source and drain (a source region and a drain region) into which the p-type impurity is doped and has a double diffused drain (DDD) structure. That is, the $p^+$ semiconductor region 11c has a shallower junction depth and a higher impurity concentration than the $p^-$ semiconductor region 10c.

The sidewall spacers SW which are made of an insulating film such as a silicon oxide film, a silicon nitride film, or a laminate film thereof are formed on sidewalls of the gate electrode GEH.

The metal silicide layer 12 is formed on the $p^+$ semiconductor region 11c, that is, on an upper surface of the $p^+$ semiconductor region 11c through the Salicide technique or the like. Note that the metal silicide layer 12 is formed also on the gate electrode GEH.

Next, a configuration of the n-channel low breakdown voltage MISFET QL which is formed in the peripheral circuit region B1 will be described in detail.

The semiconductor device includes an active region APL and the element isolation region 2 in the peripheral circuit region B1. The structure and function of the element isolation region 2 are the same as described above. The active region APL is defined, that is, partitioned by the element isolation region 2, and is electrically isolated from other active regions by the element isolation region 2, and a p-type well PW2 is formed in the active region APL. That is, the active region APL is a region in which the p-type well PW2 is formed. The p-type well PW2 is a semiconductor region which is of the p-type conductivity type.

As illustrated in FIG. 2, the low breakdown voltage MISFET QL includes a semiconductor region which is constituted by an n$^-$ semiconductor region 10b and an n$^+$ semiconductor region 11b, a gate insulating film GIL which is formed on the p-type well PW2, and a gate electrode GEL which is formed on the gate insulating film GIL. The n$^-$ semiconductor region 10b and the n$^+$ semiconductor region 11b are formed on an upper layer portion of the p-type well PW2 of the semiconductor substrate 1. Each of the n$^-$ semiconductor region 10b and the n$^+$ semiconductor region 11b is of the n-type conductivity type which is of the conductivity type opposite to the p-type conductivity type.

The gate insulating film GIL functions as a gate insulating film of the MISFET QL. The gate insulating film GIL is made of the insulating film 3. In addition, the gate electrode GEL is made of the conductor film 5.

The semiconductor region constituted by the n$^-$ semiconductor region 10b and the n$^+$ semiconductor region 11b is a semiconductor region for source and drain (a source region and a drain region) into which the n-type impurity is doped and has the LDD structure similarly to the semiconductor regions MS and MD of the memory cell MC. That is, the n$^+$ semiconductor region 11b has a shallower junction depth and a higher impurity concentration than the n$^-$ semiconductor region 10b.

The sidewall spacers SW which are made of an insulating film such as a silicon oxide film, a silicon nitride film, or a laminate film thereof are formed on sidewalls of the gate electrode GEL.

The metal silicide layer 12 is formed on the n$^+$ semiconductor region 11b, that is, on an upper surface of the n$^+$ semiconductor region 11b through the Salicide technique or the like. Note that the metal silicide layer 12 is formed also on the gate electrode GEL.

Preferably, a gate length of the high breakdown voltage MISFET QH is longer than a gate length of the low breakdown voltage MISFET QL. In addition, a drive voltage of the high breakdown voltage MISFET QH is higher than a drive voltage of the low breakdown voltage MISFET QL, and a breakdown voltage of the high breakdown voltage MISFET QH is higher than a breakdown voltage of the low breakdown voltage MISFET QL.

Preferably, a film thickness of the gate insulating film GIH is thicker than a film thickness of the gate insulating film GIL. Accordingly, it is possible to set the drive voltage of the high breakdown voltage MISFET QH to be higher than the drive voltage of the low breakdown voltage MISFET QL.

In addition, in the above-described example, the example in which a film thickness of the gate insulating film GIt of the control transistor and the film thickness of the gate insulating film GIL of the low breakdown voltage MISFET QL are the same has been described, but the film thickness of the gate insulating film GIt of the control transistor may be set to be thicker than the film thickness of the gate insulating film GIL of the low breakdown voltage MISFET QL.

Further, an interlayer insulating film 13 is formed to cover the memory cell MC, the MISFET QL, and the MISFET QH. The interlayer insulating film 13 is made of, for example, a silicon oxide film having a double-layer structure or a laminate film including a silicon nitride film and a silicon oxide film having a double-layer structure on the silicon nitride film. Further, an upper surface of the interlayer insulating film 13 is planarized. For example, the silicon oxide film having the double-layer structure can be formed by planarizing a surface of the silicon oxide film of a lower layer through the Chemical Mechanical Polishing (CMP), and then, depositing the silicon oxide film of an upper layer.

Contact holes CNT are formed in the interlayer insulating film 13, and conductive plug electrodes PG serving as a conductor portion are buried in the contact holes CNT.

The plug electrode PG is formed from a thin barrier conductor film which is formed on a bottom portion and on the sidewall, that is, the side surface of the contact hole CNT, and a main conductor film which is formed on the barrier conductor film to be buried in the contact hole CNT. FIG. 2 illustrates the barrier conductor film and the main conductor film constituting the plug electrode PG in an integrated manner for simplification of the drawing. Note that the barrier conductor film constituting the plug electrode PG can be made of, for example, a titanium (Ti) film, a titanium nitride (TiN) film, or a laminate film thereof, and the main conductor film can be made of a tungsten (W) film.

Metal wires MW are formed on the interlayer insulating film 13 in which the plug electrodes PG are buried. The metal wire MW is, for example, a tungsten (W) wire or aluminum (Al) wire. In addition, a copper wire containing copper (Cu) as the main conductive material, for example, can be used.

Next, a configuration of the laminated capacitive element CSA will be described with reference to FIGS. 3 to 6.

As illustrated in FIG. 3, the laminated capacitive element CSA has a structure in which a rectangular capacitive electrode CE1A having a long side in the longitudinal direction (Y direction), a rectangular capacitive electrode CE2A having a long side in the longitudinal direction, and a rectangular capacitive electrode CE3A having a long side in the lateral direction (X direction) are laminated. An active region AC1 is disposed in a central portion of an n-type well NW2 serving as the capacitive electrode CE1A, and active regions AC2 and AC2 are disposed on both sides of the active region AC1. The active region AC1 has a rectangular shape extending in the Y direction. The active region AC2 is a region which is configured to supply a desired potential to the n-type well NW2 constituting the capacitive electrode CE1A. That is, metal wires MW3 and MW4 are disposed on the active regions AC2, and the n-type well NW2 is electrically connected to the metal wires MW3 and MW4 via the plug electrodes PG as illustrated in FIG. 3. The same amount of potential is supplied to the metal wires MW3 and MW4, respectively.

The capacitive electrode CE2A (CE21A) is disposed to completely cover the active region AC1 in the X direction and the Y direction of the paper plane of FIG. 3. The capacitive electrode CE2A is formed over the active region AC1. The capacitive electrode CE2A has a laminated structure of a sub-electrode CE21A and a sub-electrode CE22A which is disposed on the sub-electrode CE21A via the insulating film 6 (not illustrated). Each of the sub-electrodes CE21A and CE22A has a rectangular shape illustrated using a bold line (on the outer side) in FIG. 3. This sub-electrode CE21A completely covers the active region AC1. That is, a length (width) of the sub-electrode CE21A is greater than a length (width) of the active region AC1 in each of the X direction and the Y direction.

Although the sub-electrode CE22A has the same shape (outer shape) as the sub-electrode CE21A as described above, a plurality of slits SL1 are formed in the sub-electrode CE22A, and an upper surface of the sub-electrode CE21A is exposed inside the slit SL1. FIG. 3 illustrates the slits SL1 also using a bold line (on the inner side), and each of the slits SL1 has a rectangular shape extending in the Y direction. That is, the sub-electrode CE22A is disposed on both sides of the slit SL1 such that the slit SL1 is interposed therebetween and is constituted by four grids GRy extending in the Y direction and two grids GRx defining end portions of the slit SL1 in the Y direction and extending in the X direction. The four grids GRy extending in the Y direction are coupled to the two grids GRx extending in the X direction at each end portion. The two grids GRx and the four grids GRy have the integrated structure. Here, the number of the slits SL1 is not limited to three. In addition, a width of the slit SL1 (WSL1) and a width of the grid GRy (WGRy) in the X direction are set to 90 nm in the first embodiment, respectively.

In addition, metal wires MW1 and MW2 are disposed in upper portions of the two grids GRx extending in the X direction, and the sub-electrodes CE21A and CE22A are electrically connected to the metal wires MW1 and MW2 via the plug electrode PG. The same amount of potential is supplied to the metal wires MW1 and MW2, respectively.

The capacitive electrode CE3A extends in the X direction on the capacitive electrode CE2A so as to cross the plurality of slits SL1. The metal wires MW3 and MW4 are disposed above the capacitive electrode CE3A, and the capacitive electrode CE3A is electrically connected to the metal wires MW3 and MW4 via the plug electrodes PG. That is, the capacitive electrode CE1A and the capacitive electrode CE3A are electrically connected to each other.

Next, a cross-section structure of the laminated capacitive element CSA will be described with reference to FIG. 4. FIG. 4 is a cross-sectional view illustrating an essential part taken along a line X1-X1' of FIG. 3.

The element isolation region 2 and the active region AC1 defined by the element isolation region 2 are formed in the main surface of the semiconductor substrate 1 in the peripheral circuit region C1, and the n-type well NW2 is formed below the active region AC1 and the element isolation region 2. The n-type well NW2 is the semiconductor region which is of the n-type conductivity type. The n-type well NW2 constitutes the capacitive electrode CE1A. The n-type well NW2 may be formed through the same process as the n-type well NW1 in which the p-type high breakdown voltage MISFET QH is formed.

The capacitive electrode CE2A is formed over the active region AC1 via a capacitive insulating film (dielectric film) CZ1A. The capacitive insulating film CZ1A is formed in the entire active region AC1, and the capacitive electrode CE2A (particularly, the sub-electrode CE21A) completely covers the active region AC1 and extends on the element isolation region 2 which is adjacent to the active region AC1. The capacitive insulating film CZ1A is made of the insulating film 4, and the insulating film 4 is made of an insulating film of the same layer as the gate insulating film GIH of the high breakdown voltage MISFET QH. The second capacitive electrode CE2A has a laminated structure including the sub-electrode CE21A and the sub-electrode CE22A, and the sub-electrode CE22A is disposed on the sub-electrode CE21A via the insulating film 6. The sub-electrode CE21A is made of the above-described conductor film 5, and the sub-electrode CE22A is made of the above-described conductor film 7. The sub-electrode CE22A includes mesa portions (mesa-like portions) each having a mesa shape which is defined by the plurality of slits SL1 or an end portion of the sub-electrode CE22A and the slit SL1. The mesa portion is a portion which corresponds to the above-described grid GRy extending in the Y direction. The mesa portion has an upper surface and side surfaces. Further, the insulating film 6 which is positioned between the neighboring mesa portions, that is, inside the slit SL1, is removed, and thus, the upper surface of the sub-electrode CE21A is exposed from the sub-electrode CE22A and the insulating film 6. The above-described mesa portion is also called a protruding portion when seen from the sub-electrode CE21A. That is, the capacitive electrode CE2A is constituted by the plate-shaped sub-electrode CE21A and the protruding portions (the mesa portions or the grids GRy) mounted on the sub-electrode CE21A via the insulating film 6, the protruding portions (the mesa portions or the grids GRy) have the upper surface and the side surfaces, and the upper surface of the sub-electrode CE21A is exposed in a region between the two neighboring protruding portions. The slit SL1 of the sub-electrode CE22A and the protruding portion of the sub-electrode CE22A can be expressed also as a recessed portion of the second capacitive electrode CE2A and a projecting portion of the second capacitive electrode CE2A, respectively.

A capacitive insulating film (dielectric film) CZ2A is formed to cover an upper surface and side surfaces of the capacitive electrode CE2A. That is, the capacitive insulating film CZ2A is formed along the upper surface and the side surfaces of the sub-electrode CE22A, the upper surface of the sub-electrode CE21A which is exposed from the insulating film 6, and the side surfaces of the sub-electrode CE21A. Further, the capacitive insulating film CZ2A is in contact with the upper surface and the side surfaces of the sub-electrode CE22A, the upper surface of the sub-electrode CE21A which is exposed from the insulating film 6, and the side surfaces of the sub-electrode CE21A. The capacitive insulating film CZ2A is made of the insulating film 8.

The capacitive electrode CE3A is formed over the capacitive insulating film CZ2A to oppose the capacitive electrode CE2A so as to cover the upper surfaces and the side surfaces of the capacitive electrode CE2A. The capacitive electrode CE3A opposes the upper surface of each of the mesa portions of the sub-electrode CE22A and opposes the upper surface of the sub-electrode CE21A and the side surfaces of the sub-electrode CE22A inside each of the slits SL1. The capacitive electrode CE3A continuously extends over the sub-electrode CE22A from the inside of each of the slits SL1. Further, the capacitive electrode CE3A opposes each side surface of the sub-electrodes CE21A and CE22A at an end portion of the capacitive electrode CE2A. The capacitive electrode CE3A and the capacitive insulating film CZ2A have the same plane shape. In addition, the metal silicide layer 12 is formed on an upper surface of the capacitive electrode CE3A which is made of the conductor film 9 and is connected to the metal wires MW3 and MW4 via the plug electrode PG on an outer side of the capacitive electrode CE2A.

The laminated capacitive element CSA includes a first capacitance which is constituted by the capacitive electrode CE1A, the capacitive insulating film CZ1A, and the capacitive electrode CE2A, and a second capacitance which is constituted by the capacitive electrode CE2A, the capacitive insulating film CZ2A, and the capacitive electrode CE3A. Further, the first capacitance and the second capacitance are connected in parallel, as illustrated in FIG. 3.

When the slit SL1 is provided in the sub-electrode CE22A, and the side surfaces (the sidewalls) of the mesa portion are also utilized as the capacitive element, it is possible to increase a capacitance value of the second capacitance without increasing a plane size of the capacitive element. In other words, when the sub-electrode CE22A has the above-described structure, it is possible to reduce a plane size of the laminated capacitive element CSA having a desired capacitance value.

FIG. 5 is a cross-sectional view illustrating an essential part taken along a line Y1-Y1' of FIG. 3. As illustrated in FIG. 5, the capacitive electrode CE3A is formed on the sub-electrode CE21A via the capacitive insulating film CZ2A inside the slit SL1 of the sub-electrode CE22A. The grid GRx of the sub-electrode CE22A is disposed on the sub-electrode CE21A via the insulating film 6 in the end portion of the capacitive electrode CE2A, and the upper surface of the sub-electrode CE21A is exposed in the region between the grid GRx of the sub-electrode CE22A and the capacitive electrode CE3A. The metal silicide layer 12 is formed on the upper surface of the sub-electrode CE21A, and the metal wire MW1 or MW2 is electrically connected to the sub-electrode CE21A via the plug electrode PG and the metal silicide layer 12. In addition, the plug electrode PG is also connected to the metal silicide layer 12 which is formed on the upper surface of the sub-electrode CE22A. That is, the metal wire MW1 or MW2 is electrically connected to the sub-electrode CE21A and CE22A via the plug electrode PG formed inside the contact hole CNT provided in the interlayer insulating film 13.

Although the example in which the sub-electrodes CE21A and CE22A are connected to the metal wire MW1 or MW2 via the plug electrode PG formed in the single contact hole CNT has been described, the plug electrodes PG to be connected to the sub-electrodes CE21A and CE22A may be formed as separate members.

FIG. 6 is a cross-sectional view illustrating an essential part taken along a line Y2-Y2' of FIG. 3. As illustrated in FIG. 6, the n-type well NW2 constituting the capacitive electrode CE1A is formed in the main surface of the semiconductor substrate 1, the capacitive electrode CE2A is formed over the active region AC1 via the capacitive insulating film (dielectric film) CZ1A, and the capacitive electrode CE3A is formed on the capacitive electrode CE2A via the capacitive insulating film (dielectric film) CZ2A.

<Method of Manufacturing Semiconductor Device>

FIGS. 7 to 17 are cross-sectional views each illustrating an essential part of the semiconductor device during a manufacturing process according to the first embodiment. FIGS. 7 to 17 illustrate cross-sections, taken along the line X1-X1', of the memory cell MC in the memory cell region A, the low breakdown voltage MISFET QL in the peripheral circuit region B1, and the laminated capacitive element CSA in the peripheral circuit region C1.

Figure 7:
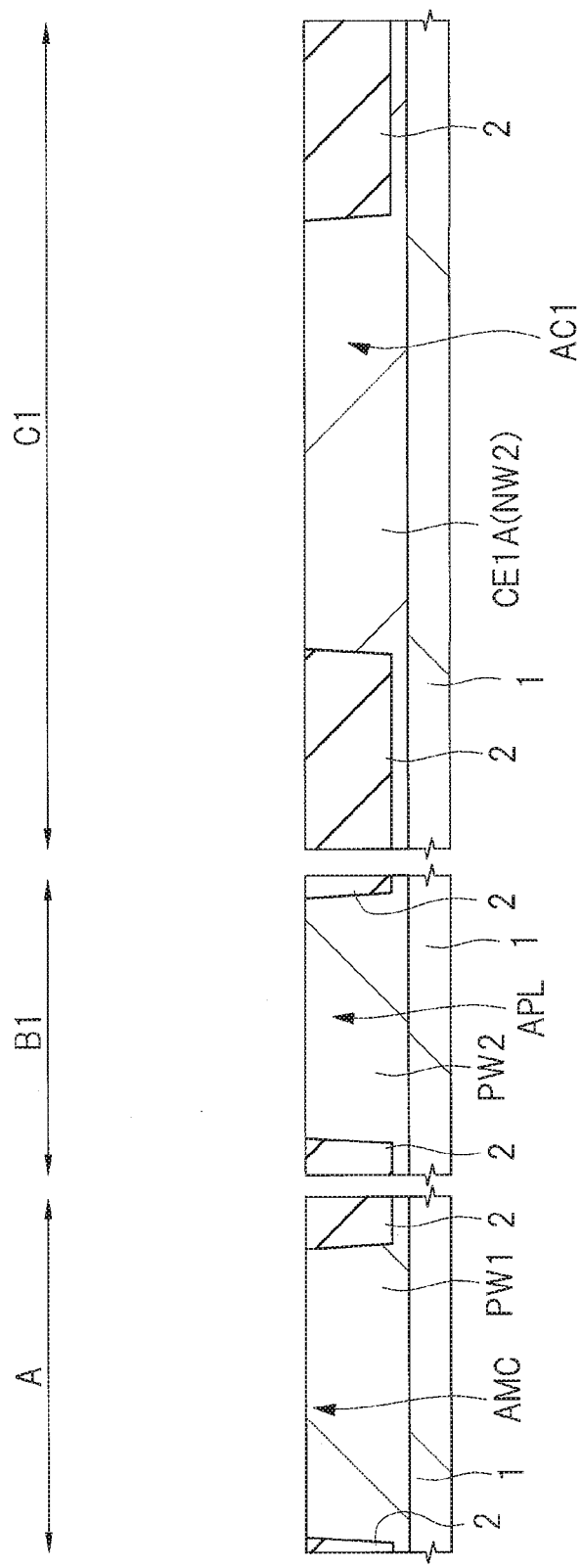
FIG. 7 is a cross-sectional view illustrating an essential part of the semiconductor device during a manufacturing process according to the first embodiment.

FIG. 7 illustrates a process of preparing the semiconductor substrate. The semiconductor substrate 1 is the semiconductor wafer which is made of, for example, the p-type monocrystalline silicon having the specific resistance of about 1 to 10 Ωcm. The p-type wells PW1 and PW2, and the n-type well NW2 are formed in the semiconductor substrate 1. Further, the element isolation region 2 is formed in the main surface of the semiconductor substrate 1, and the active regions AMC, APL, and AC1 are defined (partitioned) by the element isolation region 2. The element isolation region 2 is the insulator and is made of the silicon oxide film or the like.

Figure 8:
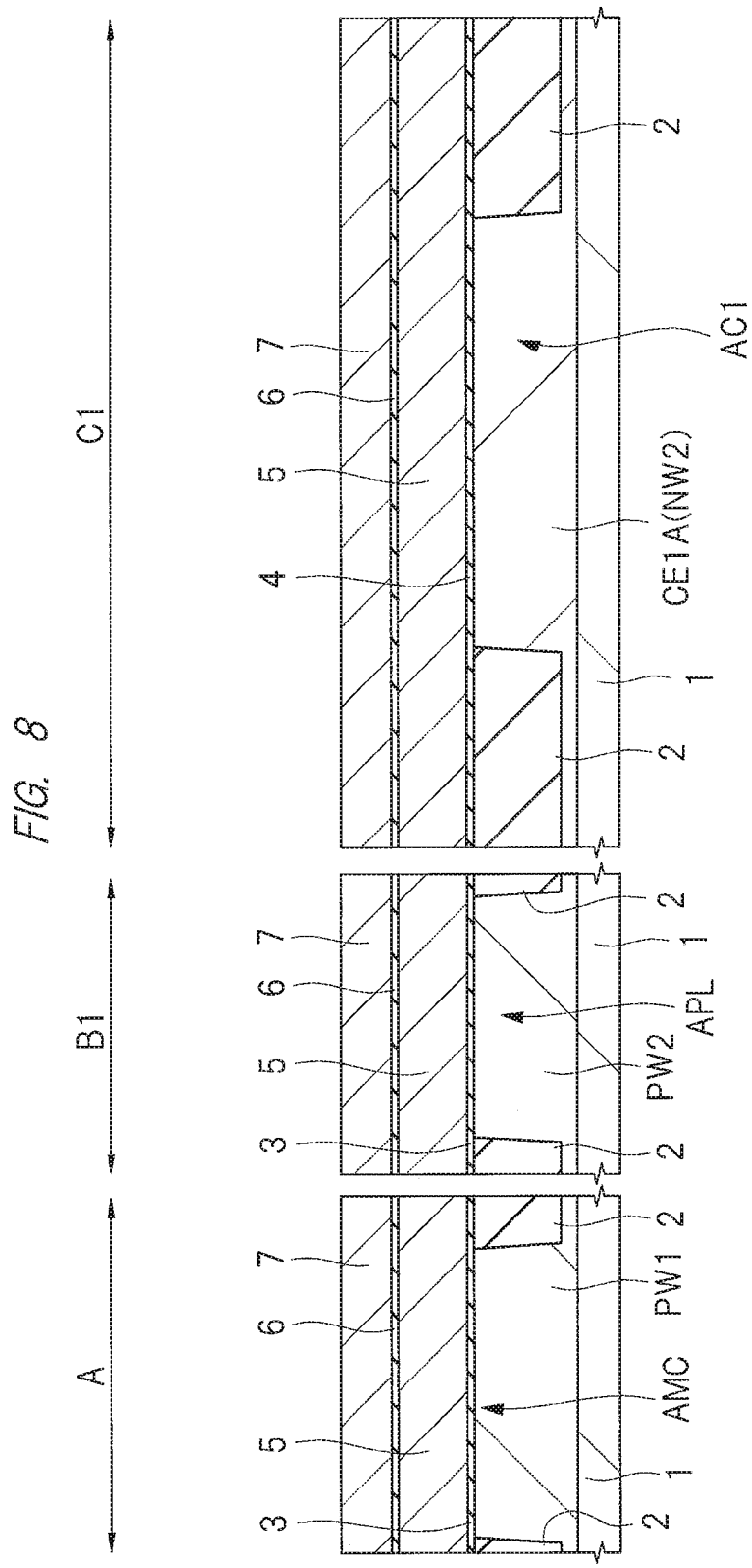
FIG. 8 is a cross-sectional view illustrating an essential part of the semiconductor device during the manufacturing process according to the first embodiment.

Next, FIG. 8 illustrates processes of forming the insulating films 3 and 4, the conductor film 5, the insulating film 6, and the conductor film 7. In the processes of forming the insulating films 3 and 4, the insulating film 3 is formed on the main surface of the semiconductor substrate 1 in the active regions AMC and APL, and the insulating film 4 is formed on the main surface of the semiconductor substrate 1 in the active region AC1. The insulating films 3 and 4 are formed by the Chemical Vapor Deposition (CVD), the Atomic Layer Deposition (ALD), thermal oxidation, or a combination thereof. The insulating film 3 or 4 is formed on the active regions AMC, APL, and AC1, and the element isolation region 2 in the case of using the CVD or the ALD but is formed only on the active regions AMC, APL, and AC1 in the case of using thermal oxidation.

A film thickness of the insulating film 4 is preferably set to be thicker than a film thickness of the insulating film 3 in terms of the breakdown voltage. It is preferable to form the insulating film 4 in the same process with the gate insulating film GIH of the high breakdown voltage MISFET QH described above in order to reduce the number of processes of manufacturing the semiconductor device. In addition, it is also preferable to form the n-type well NW2 in the same process as the above-described n-type well NW1.

In the processes of forming the conductor film 5, the insulating film 6, and the conductor film 7, the conductor film 5, the insulating film 6, and the conductor film 7 are sequentially formed on the insulating film 3 or 4 in the memory cell region A and the peripheral circuit regions B1 and C1. The conductor films 5 and 7 are the polycrystalline silicon films and are formed by the CVD. A film thickness of the conductor film 5 is set to 50 to 60 nm, and a film thickness of the conductor film 7 is set to 50 to 100 nm. In addition, the insulating film 6 is provided to insulate the conductor film 5 from the conductor film 7, and a film thickness thereof is set to 5 to 15 nm.

Figure 9:
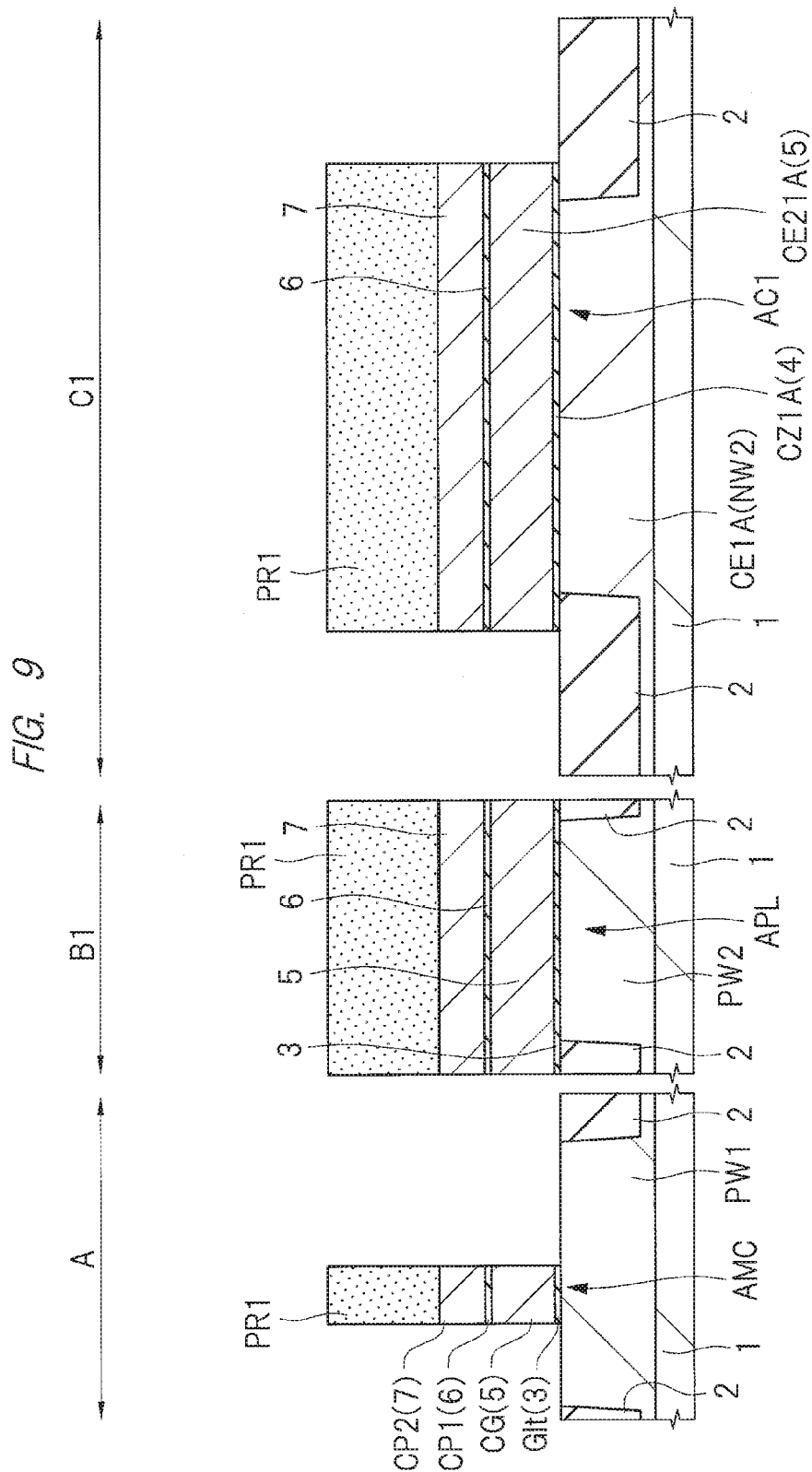
FIG. 9 is a cross-sectional view illustrating an essential part of the semiconductor device during the manufacturing process according to the first embodiment.

Next, FIG. 9 illustrates a process of processing (patterning) the conductor film 5, the insulating film 6, and the conductor film 7. In this process, the conductor film 7, the insulating film 6, and the conductor film 5 are patterned by, for example, photolithography and etching.

First, a resist film PR1 is formed on the conductor film 7. The resist film PR1 has a pattern which covers a predetermined region to form the control gate electrode CG and exposes the other part in the memory cell region A. Further, the resist film PR1 has a pattern which covers the peripheral circuit region B1, covers a predetermined region to form the capacitive electrode CE2A, and exposes the other part in the peripheral circuit region C1.

Subsequently, the conductor film 7, the insulating film 6, and the conductor film 5 are patterned using the resist film PR1 as an etching mask by, for example, anisotropic dry etching or the like. Accordingly, in the memory cell region A, the cap layer CP2 made of the conductor film 7, the cap insulating film CP1 made of the insulating film 6, and the control gate electrode CG made of the conductor film 5 are formed, and further, the gate insulating film GIt made of the insulating film 3 between the control gate electrode CG and the p-type well PW1 of the semiconductor substrate 1 is formed. That is, the control gate electrode CG is formed on the p-type well PW1 of the semiconductor substrate 1 via the gate insulating film GIt in the memory cell region A. Further, the cap layer CP2 is formed on the control gate electrode CG via the cap insulating film CP1.

In addition, the sub-electrode CE21A made of the conductor film 5 and the capacitive insulating film CZ1A made of the insulating film 4 are formed in the peripheral circuit region C1 to have the same pattern as the pattern of the resist film PR1. The insulating film 6 on the conductive film 5 and the conductive film 7 are processed to have the same plane shape as the sub-electrode CE21A. The pattern of the resist film PR1 in the peripheral circuit region C1 corresponds to a rectangular pattern of the sub-electrode CE21A which is illustrated using the bold line (on the outer side) in FIG. 3.

The resist film PR1 is removed after the process of processing (patterning) the conductor film 5, the insulating film 6, and the conductor film 7.

Figure 10:
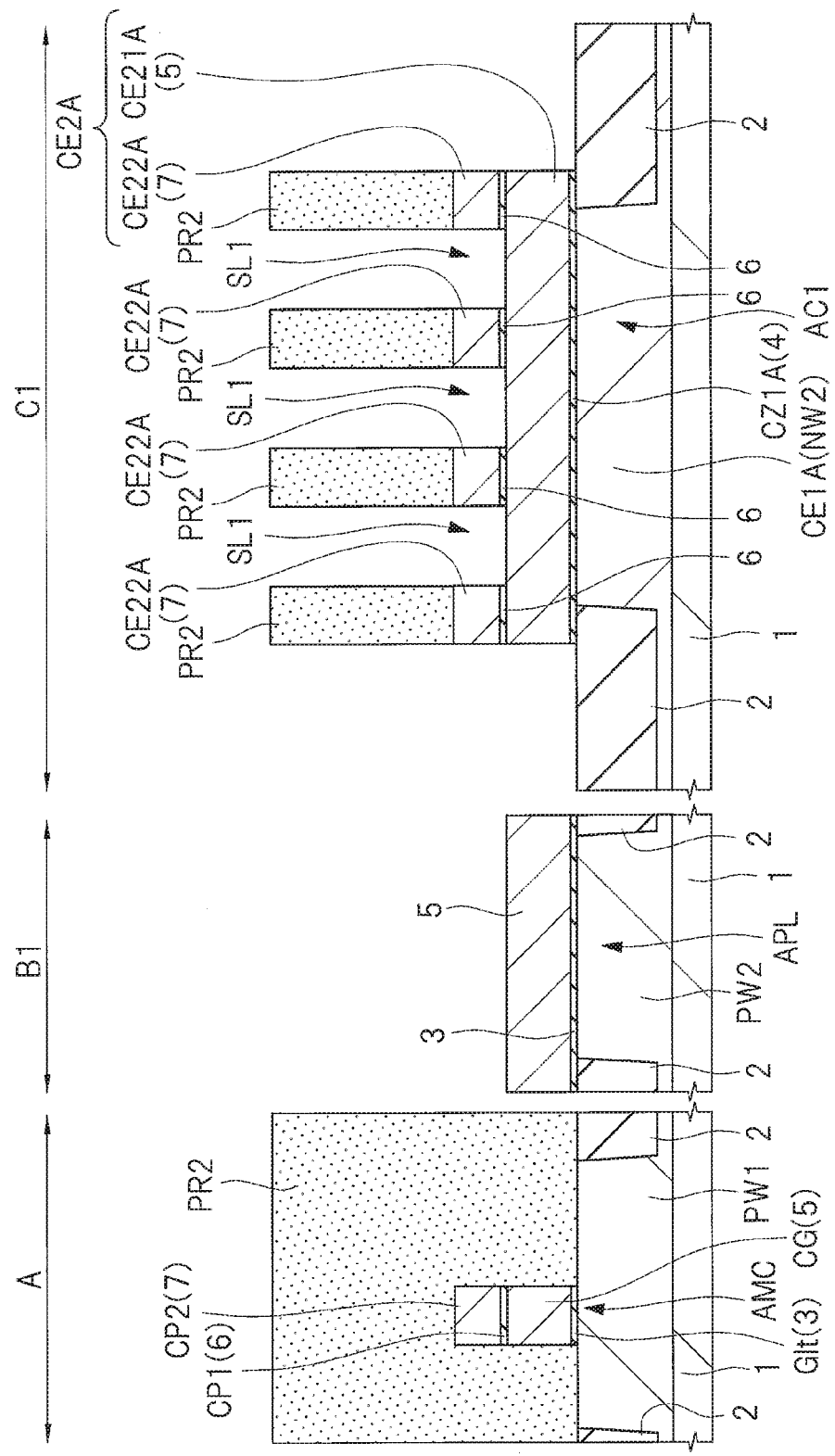
FIG. 10 is a cross-sectional view illustrating an essential part of the semiconductor device during the manufacturing process according to the first embodiment.

Next, FIG. 10 illustrates a process of forming the sub-electrode CE22A. In this process, the conductor film 7 and the insulating film 6 are patterned by, for example, photolithography and etching.

First, a resist film PR2 is formed on the conductor film 7. The resist film PR2 has a pattern which covers the memory cell region A and exposes the peripheral circuit region B1. Further, the resist film PR2 has a pattern which covers the mesa portions of the sub-electrode CE22A and exposes the other part in the peripheral circuit region C1.

Subsequently, the conductor film 7 and the insulating film 6 are patterned using the resist film PR2 as an etching mask by, for example, anisotropic dry etching or the like. Accordingly, the insulating film 6 and the conductor film 7 on the conductor film 5 are removed in the peripheral circuit region B1, and the upper surface of the conductor film 5 is exposed. The plurality of slits SL1 are formed in the sub-electrode CE22A, and the mesa portions are formed between the slits SL1 and at ends of the slits SL1 in the peripheral circuit region C1. The insulating film 6 on the sub-electrode CE21A is removed inside each of the slits SL1, and the upper surface of the sub-electrode CE21A is exposed. The pattern of the resist film PR2 in the peripheral circuit region C1 corresponds to a grid-like pattern of the sub-electrode CE22A illustrated using the bold line (on the outer side) in FIG. 3. The resist film PR2 is removed after the process of forming the sub-electrode CE22A.

Note that the insulating film 6 can function as an etching stopper at the time of anisotropic dry etching of the conductor film 7, and thus, it is possible to prevent or reduce the digging of the conductor film 5 in the etching process of the conductor film 7, thereby reducing a variation of the capacitance value of the second capacitive element.

Figure 11:
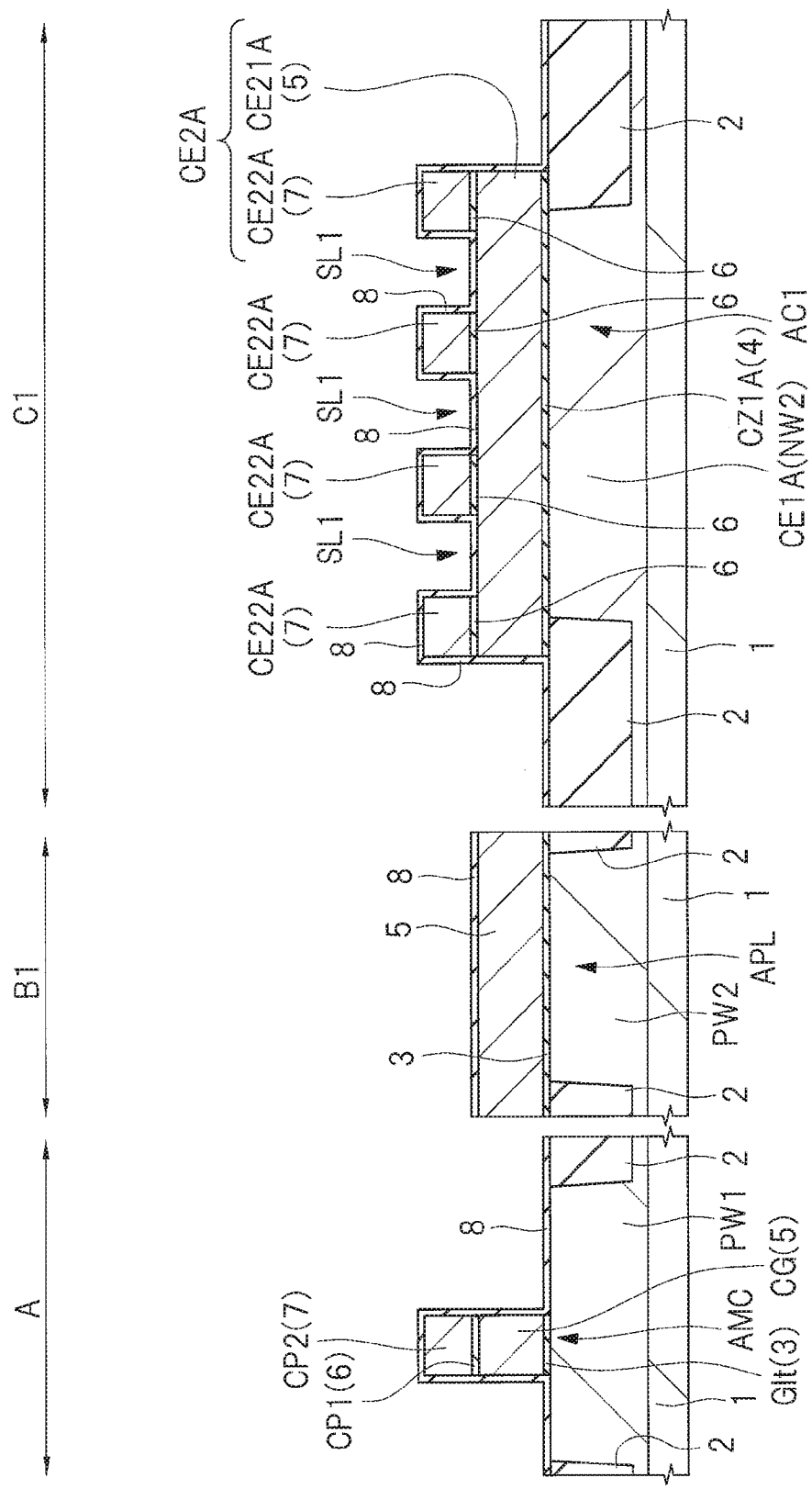
FIG. 11 is a cross-sectional view illustrating an essential part of the semiconductor device during the manufacturing process according to the first embodiment.

Next, FIG. 11 illustrates a process of forming the insulating film 8. The insulating film 8 for the gate insulating film GIm of the memory transistor is formed on the main surface of the semiconductor substrate 1 in the memory cell region A and the peripheral circuit regions B1 and C1. At this time, the insulating film 8 is formed on the main surface of the semiconductor substrate 1 of the exposed part, the side surfaces of the control gate electrode CG and the cap insulating film CP1, and the upper surface and the side surfaces of the cap layer CP2 in the memory cell region A. In addition, the insulating film 8 is formed on the upper surface of the conductor film 5 of the remaining part of the peripheral circuit region B1. The insulating film 8 is formed on the upper surface and the side surfaces of the sub-electrode CE22A, on the upper surface of the sub-electrode CE21A exposed inside the slits SL1 of the sub-electrode CE21A, and on the side surfaces of the sub-electrode CE21A in the peripheral circuit region C1.

The insulating film 8 is made up of the laminate film including the silicon oxide film on the lower side, the silicon nitride film, and the silicon oxide film on the upper side which are sequentially formed from the semiconductor substrate 1 side. The silicon oxide film on the lower side can be formed at temperatures of about 1000 to 1100° C. by thermal oxidation or the ISSG oxidation, for example. The silicon nitride film and the silicon oxide film on the upper side can be formed by the CVD, for example. A film thickness (T8) of the insulating film 8 is about 15 nm. Here, it is preferable that a width of the slit SL1 be sufficiently wide such that the slit SL1 is not filled when the insulating film 8 is formed inside each of the slits SL1 and the conductor film 9 to be formed in the next process enters the inside of each of the slits SL1.

Figure 12:
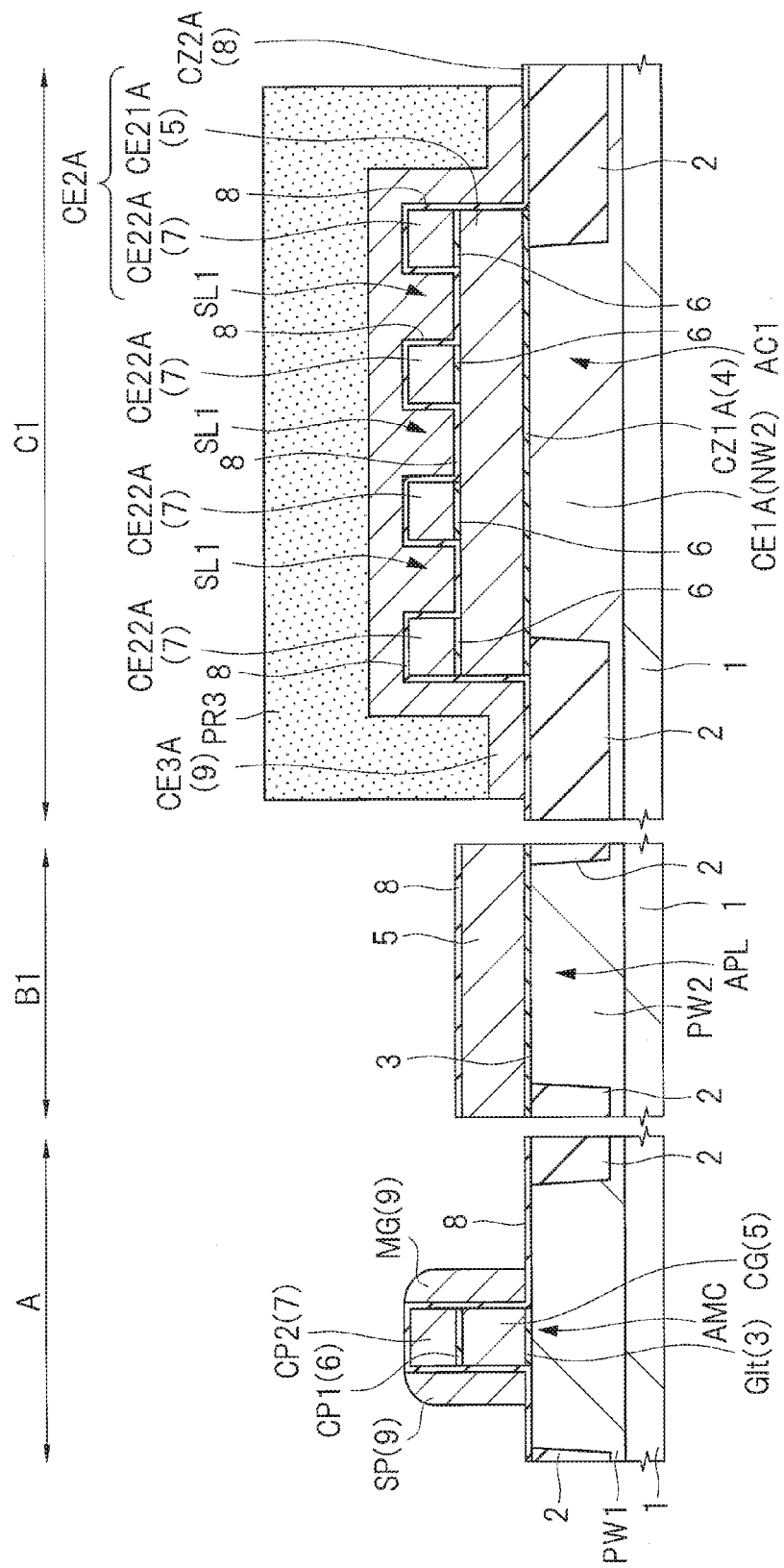
FIG. 12 is a cross-sectional view illustrating an essential part of the semiconductor device during the manufacturing process according to the first embodiment.

Next, FIG. 12 illustrates a process of forming the memory gate electrode MG. First, the conductor film 9 is formed on the insulating film 8 in the memory cell region A and the peripheral circuit regions B1 and C1. The conductor film 9 is the polycrystalline silicon film and is formed by the CVD. A film thickness of the conductor film 9 is set to 50 to 60 nm. As illustrated in FIG. 12, the width of the slit SL1 is sufficiently wide in the peripheral circuit region C1, and thus, the conductor film 9 is buried in a bottom portion of each of the slits SL1 even after the insulating film 8 is formed inside each of the slits SL1 of the sub-electrode CE22A. The conductor film 9 is in contact with the insulating film 8 which is formed on the upper surface of the sub-electrode CE21A, inside each of the slits SL1.

Next, a resist film PR3 is formed on the conductor film 9. The resist film PR3 has a pattern which exposes the memory cell region A and the peripheral circuit region B1. Further, the resist film PR3 has a pattern which covers a predetermined region to form the capacitive electrode CE3A and exposes the other part in the peripheral circuit region C1. In the first embodiment, the resist film PR3 covers the slits SL1 and the mesa portions of the capacitive electrode CE2A since the capacitive electrode CE3A is formed also on the sub-electrode CE22A.

Subsequently, the conductor film 9 is patterned using the resist film PR3 as an etching mask by, for example, anisotropic dry etching or the like. Further, the memory gate electrode MG which is made of the conductor film 9 remaining like the sidewall spacer via the insulating film 8 is formed on a first side, that is, on the sidewall on a side on which the memory gate electrode MG adjacent to the control gate electrode CG is disposed, among the sidewalls on both sides of the control gate electrode CG in the memory cell region A as illustrated in FIG. 12. In addition, the spacer SP which is made of the conductor film 9 remaining like the sidewall spacer via the insulating film 8 is formed on the sidewall opposite to the first side, that is, on the sidewall opposite to the side on which the memory gate electrode MG adjacent to the control gate electrode CG is disposed, among the sidewalls on both sides of the control gate electrode CG.

The cap layer CP2 is formed on the control gate electrode CG via the cap insulating film CP1. The memory gate electrode MG is formed along a sidewall of a laminated body including the control gate electrode CG, the cap insulating film CP1, and the cap layer CP2, and thus, it is possible to prevent the height of the memory gate electrode MG from being lowered.

The conductor film 9 formed on the insulating film 8 is removed in the peripheral circuit region B1, and the insulating film 8 is exposed.

As illustrated in FIG. 12, the capacitive electrode CE3A made of the conductor film 9 is formed in the peripheral circuit region C1. The pattern of the resist film PR3 in the peripheral circuit region C1 corresponds to a rectangular pattern of the capacitive electrode CE3A in FIG. 3, and the rectangular pattern of the capacitive electrode CE3A is formed by the above-described anisotropic dry etching. However, the conductor film 9 like the sidewall spacer remains on the sidewalls of the capacitive electrode CE2A which protrude from the rectangular pattern of the capacitive electrode CE3A of FIG. 3.

Figure 13:
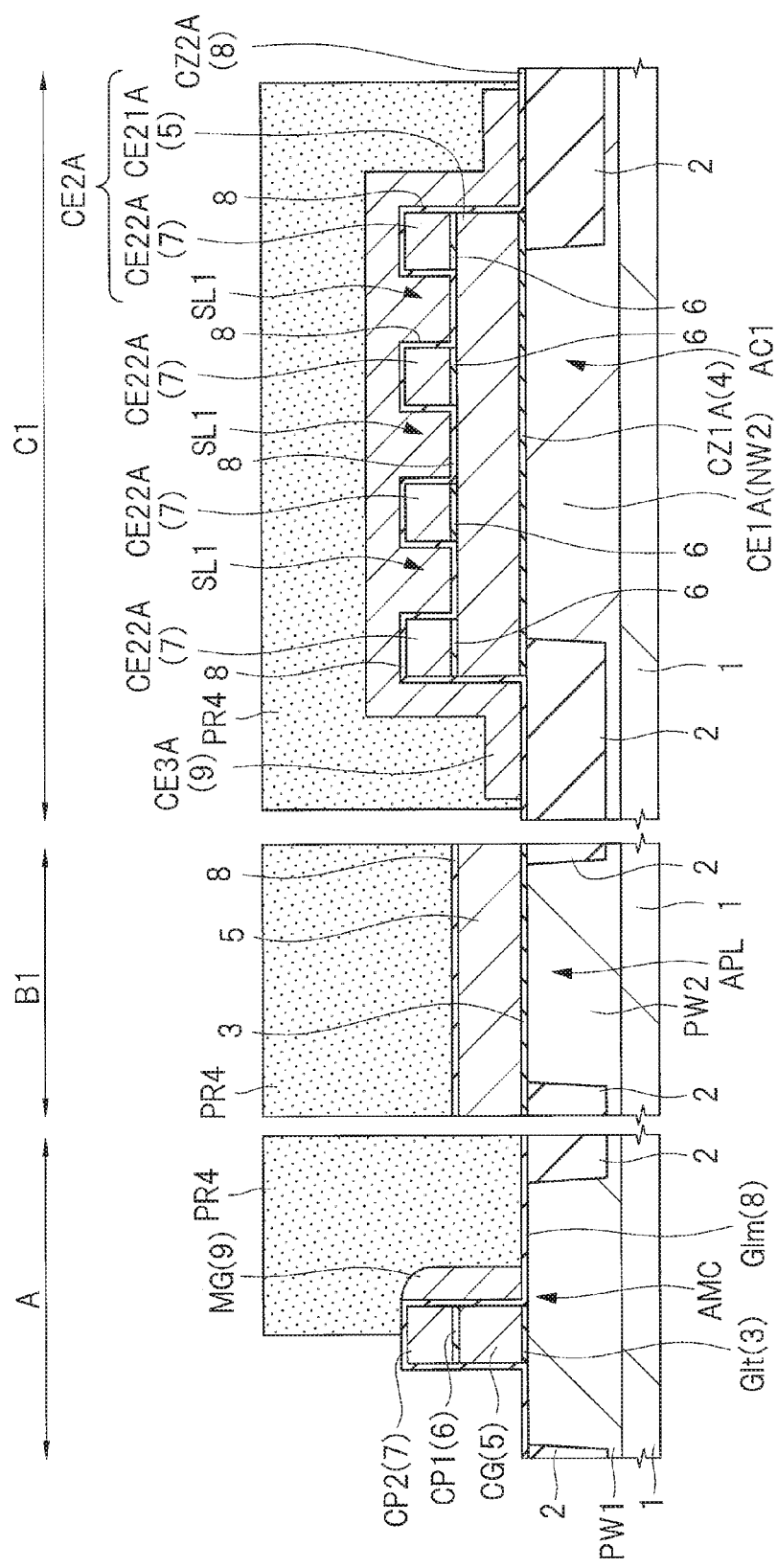
FIG. 13 is a cross-sectional view illustrating an essential part of the semiconductor device during the manufacturing process according to the first embodiment.

Next, FIG. 13 illustrates a process of removing the spacer SP. In this process, the spacer SP is removed by, for example, photolithography and etching.

First, a resist film PR4 which covers the memory gate electrode MG is formed in the memory cell region A, and the spacer SP is removed by wet etching. The resist film PR4 covers the peripheral circuit region B1 and covers the entire capacitive electrode CE3A in the peripheral circuit region C1. A pattern of the resist film PR4 in the peripheral circuit region C1 is a pattern which is slightly larger than the pattern of the capacitive electrode CE3A of FIG. 3, and the above-described conductor film 9 like the sidewall spacer remaining on the sidewalls of the capacitive electrode CE2A is removed using the resist film PR4 as a mask. The spacer SP and the conductor film 9 are removed in the same process. In this manner, the patterning of the capacitive electrode CE3A is completed. The resist film PR4 is removed after completing the process of removing the spacer SP.

Next, a process of removing the insulating film 8 is performed. The insulating film 8 in a region exposed from the conductor film 9 is removed using the conductor film 9 as a mask by wet etching. That is, in the memory cell region A, the insulating film 8 is caused to remain between the laminated body which includes the control gate electrode CG, the cap insulating film CP1, and the cap layer CP2 and the memory gate electrode MG, and between the memory gate electrode MG and the semiconductor substrate 1, and the insulating film 8 of the other part is removed. In the peripheral circuit region B1, the insulating film 8 on the conductor film 5 is removed, and the upper surface of the conductor film 5 is exposed. In the peripheral circuit region C1, the insulating film 8 is caused to remain only under the capacitive electrode CE3A, and the insulating film 8 of the other part is removed. The insulating film 8 having the same plane shape as the capacitive electrode CE3A remains, thereby forming the capacitive insulating film CZ2A.

Figure 14:
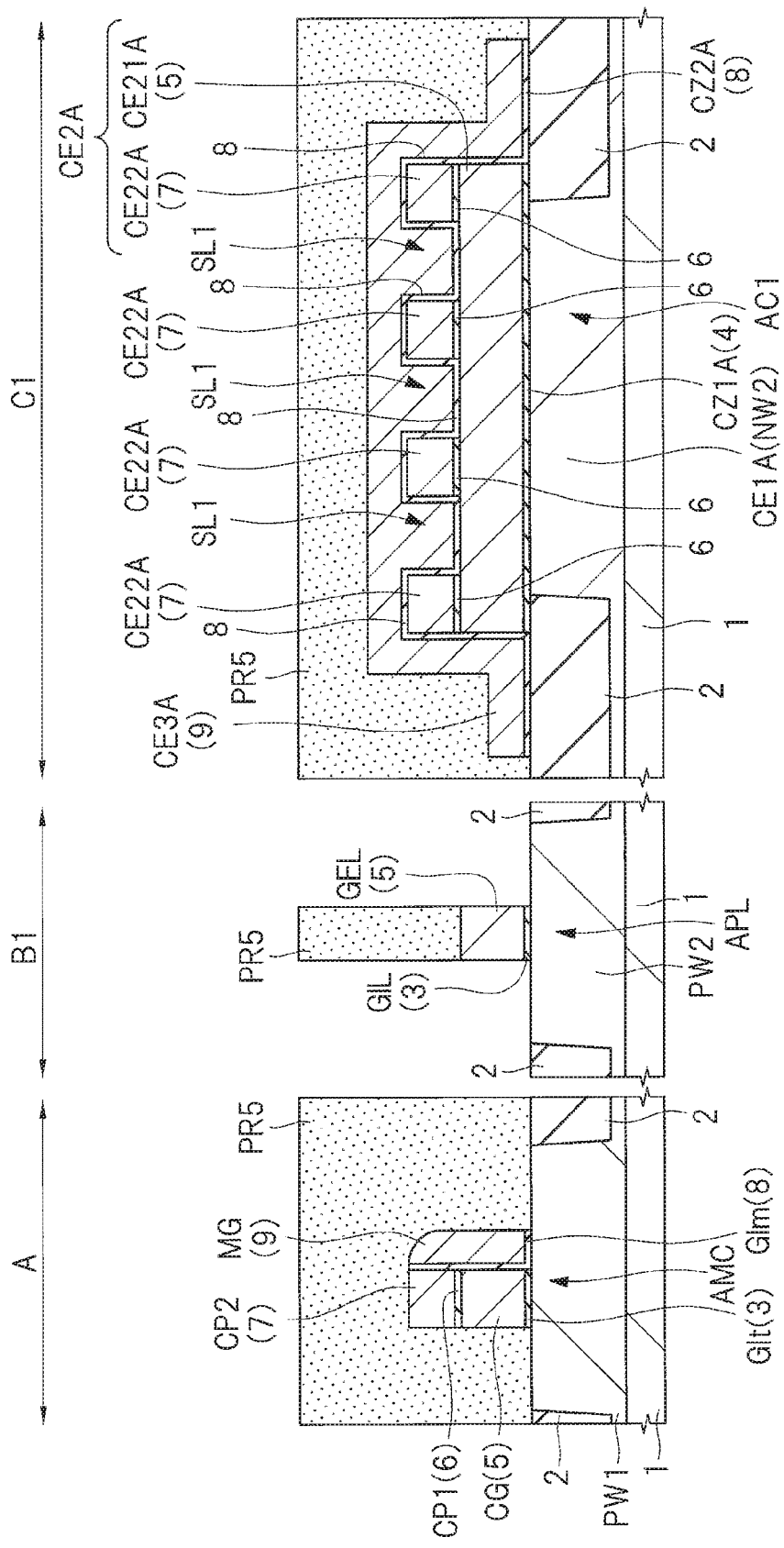
FIG. 14 is a cross-sectional view illustrating an essential part of the semiconductor device during the manufacturing process according to the first embodiment.

Next, FIG. 14 illustrates a process of forming the gate electrode GEL. In this process, the conductor film 5 is patterned by, for example, photolithography and etching. A resist film PR5 having a pattern which covers a predetermined region to form the gate electrode GEL and exposes the other part is formed in the peripheral circuit region B1. Further, the conductor film 5 is subjected to dry etching using the resist film PR5 as a mask, thereby forming the gate electrode GEL. The resist film PR5 covers the entire region of the memory cell region A and the peripheral circuit region C1.

Figure 15:
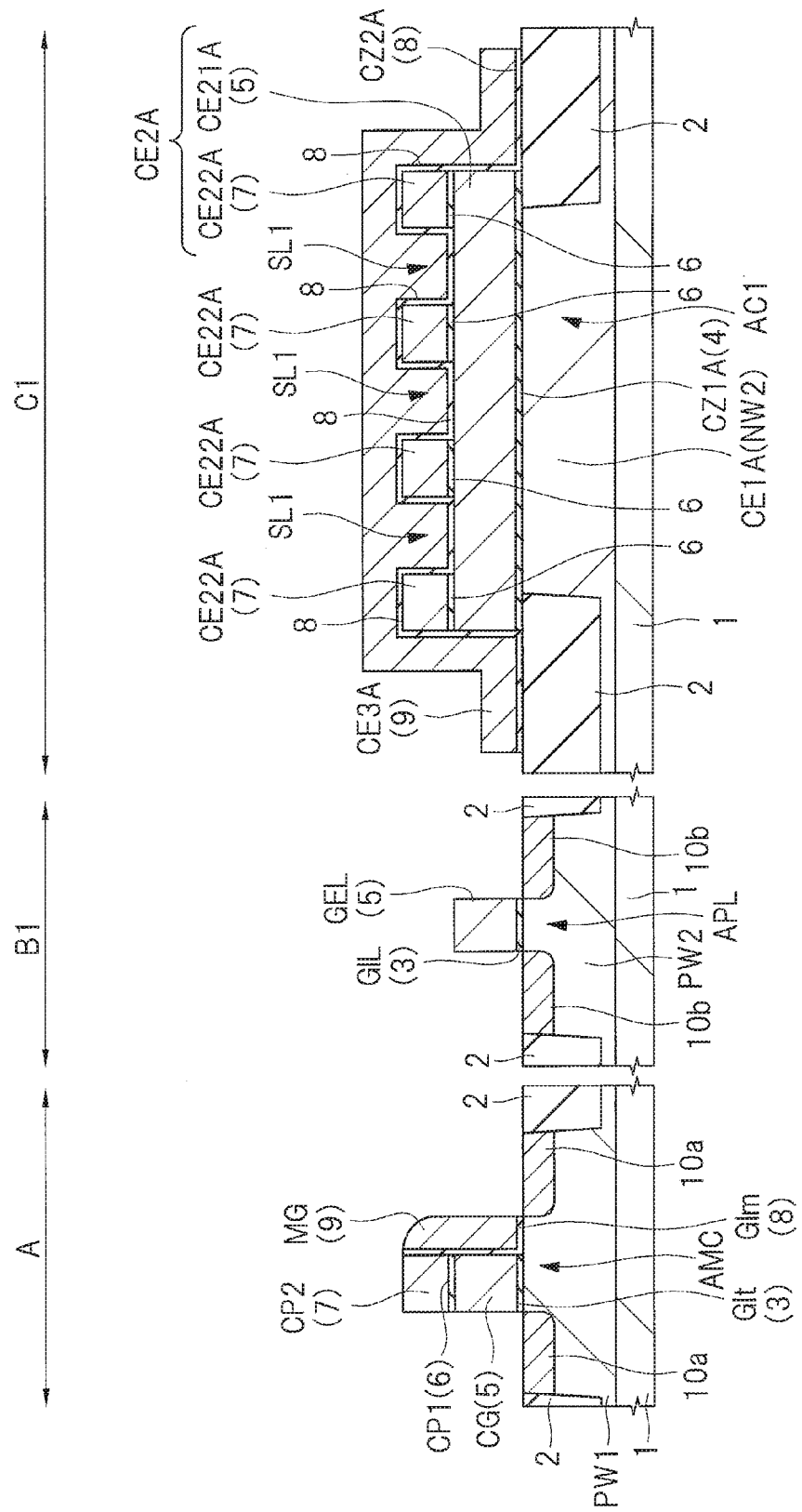
FIG. 15 is a cross-sectional view illustrating an essential part of the semiconductor device during the manufacturing process according to the first embodiment.

Next, FIG. 15 illustrates a process of forming the n⁻ semiconductor regions 10a and 10b. The n-type impurity, for example, arsenic (As), phosphorus (P), or the like, is doped into the p-type wells PW1 and PW2 of the semiconductor substrate 1 using the control gate electrode CG, the memory gate electrode MG, the gate electrode GEL, and the element isolation film 2 as a mask, and the n⁻ semiconductor regions 10a and 10b are formed.

At this time, the n⁻ semiconductor region 10a is self-aligned and formed on the side surface of the memory gate electrode MG or the side surface of the control gate electrode CG in the memory cell region A. Further, the n⁻ semiconductor regions 10b are self-aligned and formed on side surfaces of the gate electrode GEL in the peripheral circuit region B1.

Figure 16:
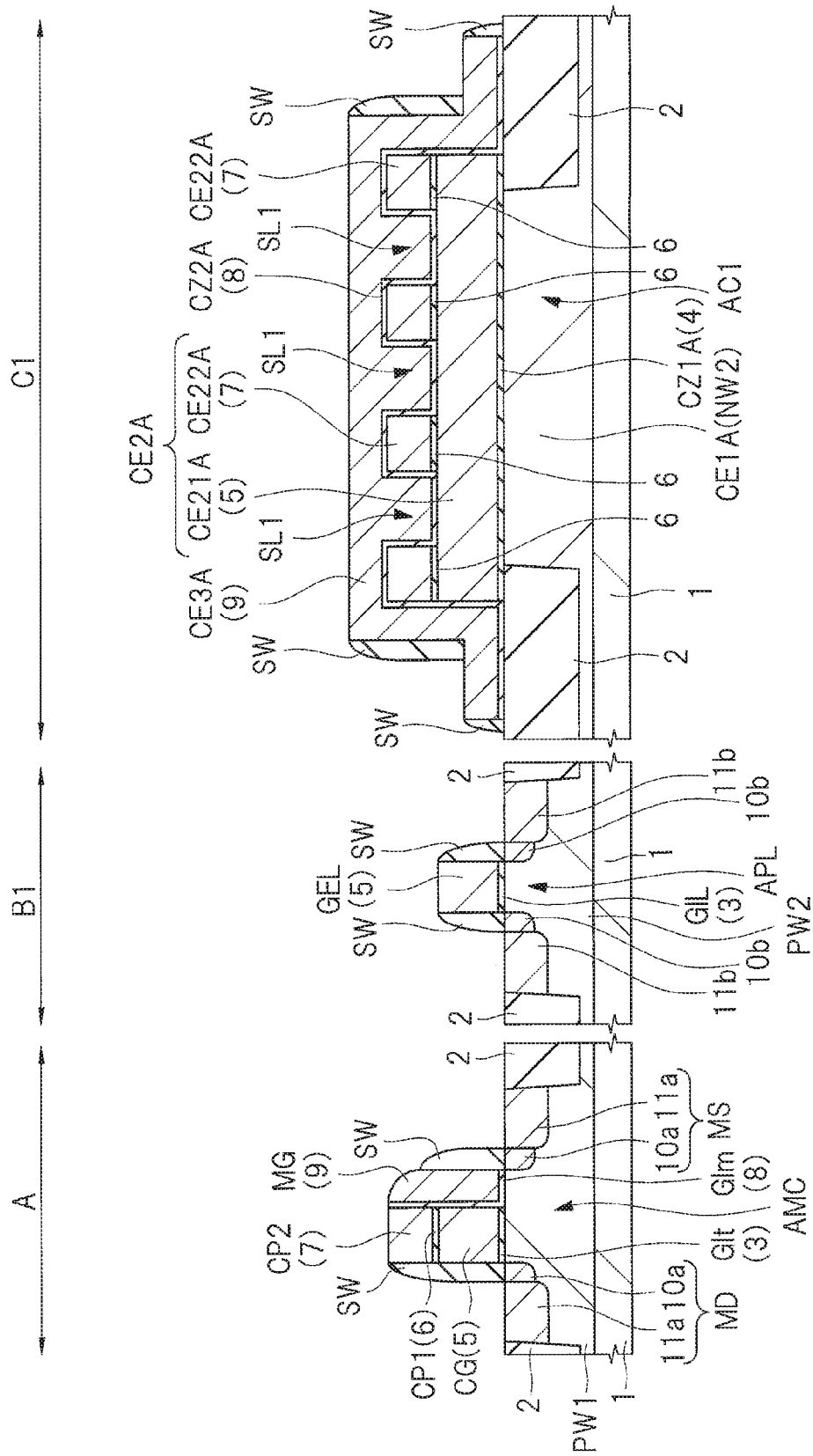
FIG. 16 is a cross-sectional view illustrating an essential part of the semiconductor device during the manufacturing process according to the first embodiment.

Next, FIG. 16 illustrates a process of forming the sidewall spacer SW and the n⁺ semiconductor regions 11a and 11b. As illustrated in FIG. 16, the sidewall spacer SW is formed on the sidewall of the control gate electrode CG, on the sidewall of the memory gate electrode MG, on the sidewalls of the gate electrode GEL, and on the sidewalls of the capacitive electrode CE3A. The sidewall spacer SW is made of the insulating film such as the silicon oxide film, the silicon nitride film, or the laminate film thereof.

Next, the n⁺ semiconductor regions 11a and 11b are formed by ion implantation or the like. The n-type impurity, for example, arsenic (As), phosphorus (P), or the like, is doped into the p-type wells PW1 and PW2 of the semiconductor substrate 1 using the control gate electrode CG, the memory gate electrode MG, and the gate electrode GEL, and the sidewall spacers SW, and the element isolation films 2 formed on the respective sidewalls thereof as a mask. Accordingly, the n⁺ semiconductor regions 11a and 11b are formed.

In addition, an n⁺ semiconductor region is formed also inside the active region AC2 of FIG. 3 in the same process as the above-described process of forming the n⁺ semiconductor regions 11a and 11b although not illustrated.

At this time, the n⁺ semiconductor region 11a is self-aligned and formed on the sidewall of the memory gate electrode MG or on the sidewall spacer SW on the sidewall of the control gate electrode CG in the memory cell region A. Further, the n⁺ semiconductor regions 11b are self-aligned and formed on the sidewall spacers SW on both the sidewalls of the gate electrode GEL in the peripheral circuit region B1.

Figure 17:
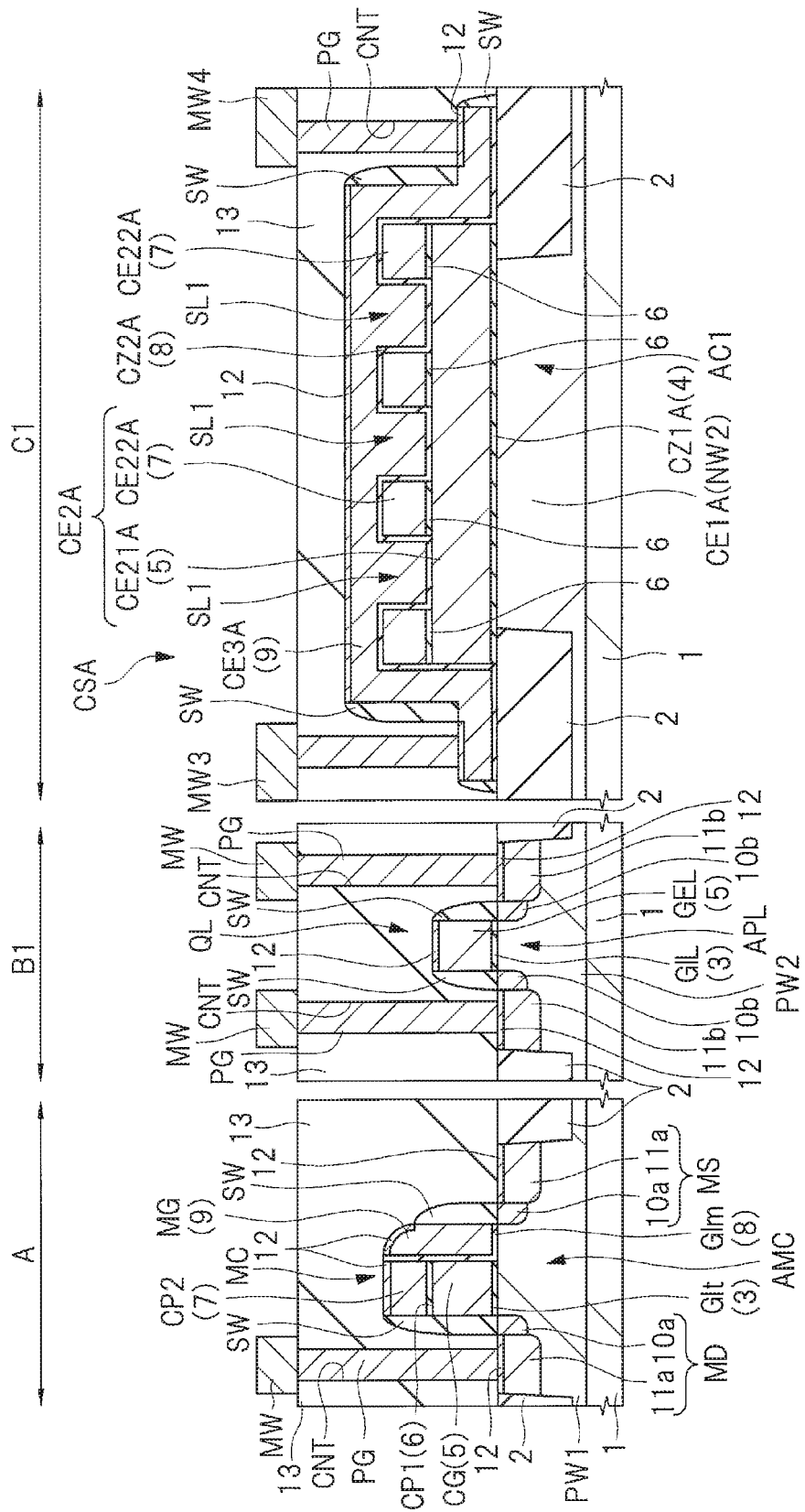
FIG. 17 is a cross-sectional view illustrating an essential part of the semiconductor device during the manufacturing process according to the first embodiment.

Next, FIG. 17 illustrates a process of forming the metal silicide layer 12, the interlayer insulating film 13, the plug electrode PG, and the metal wires MW, MW3, and MW4. First, the metal silicide layer 12 is formed as illustrated in FIG. 17. The metal silicide layer 12 is formed on each upper surface of the n⁺ semiconductor regions 11a and 11b, the cap layer CP2, the memory gate electrode MG, the gate electrode GEL, and the capacitive electrode CE3A by performing a known Salicide process. In addition, the metal silicide layer 12 is also formed in the exposed regions of the sub-electrodes CE21A and CE22A as illustrated in FIG. 5 or 6.

Next, the interlayer insulating film 13 is formed to cover the memory cell MC, the low breakdown voltage MISFET QL, and the laminated capacitive element CSA as illustrated in FIG. 17. For example, the silicon oxide film of the lower layer is formed to cover the memory cell MC, the low breakdown voltage MISFET QL, and the laminated capacitive element CSA, and then, the silicon oxide film of the upper layer is formed after planarizing a surface of the silicon oxide film of the lower layer using the CMP method, thereby forming the interlayer insulating film 13 with the planarized surface.

Next, the contact holes CNT which expose a surface of the metal silicide layer 12 are formed in the interlayer insulating film 13, and the plug electrodes PG are formed inside the contact holes CNT.

Next, the metal wires MW, MW3, and MW4 are formed on the interlayer insulating film 13 so as to be in contact with the plug electrodes PG, respectively. Regardless to say, the metal wires MW1 and MW2 illustrated in FIG. 5 are also formed at the same time.

<Characteristics of Semiconductor Device and Method of Manufacturing the Same>

The memory cell included in the semiconductor device includes the control gate electrode CG which is formed on the semiconductor substrate 1 via the gate insulating film GIt, the cap layer CP2 which is formed on the control gate electrode CG via the cap insulating film CP1, and the memory gate electrode MG which is formed on the semiconductor substrate 1 via the gate insulating film GIm. The capacitive element in the peripheral circuit region C1 include the capacitive electrode CE2A which is constituted by the sub-electrode CE21A and the sub-electrode CE22A including the mesa portions (protruding portions) disposed on the sub-electrode CE21A at a predetermined interval and each having the upper surface and the side surfaces, the capacitive insulating film CZ2A which is formed along the upper surface of the sub-electrode CE21A and the upper surface and the side surfaces of the sub-electrode CE22A, and the capacitive electrode CE3A which is formed on the capacitive insulating film CZ2A. Further, the control gate electrode CG and the sub-electrode CE21A are formed of the conductor film 5, the cap layer CP2 and the sub-electrode CE22A are formed of the conductor film 7, and the memory gate electrode MG and the capacitive electrode CE3A are formed of the conductor film 9.

Since the side surfaces of the sub-electrode CE22A are set as the capacitor portion of the capacitive element, it is possible to increase a capacitance value per unit area of the capacitive element when seen in a plan view and to reduce a size of the capacitive element.

Since the capacitive electrode CE3A is disposed also on the upper surface of the sub-electrode CE22A via the capacitive insulating film CZ2A, it is possible to further increase the capacitance value of the capacitive element.

Since the metal silicide layers 12 are formed, respectively, on the upper surface of the cap layer CP2 and the upper surface of the memory gate electrode MG, and the cap layer CP2 is insulated from the control gate electrode CG by the cap insulating film CP1 even if both the metal silicide layers 12 are short-circuited, it is possible to prevent the memory gate electrode MG from being short-circuited from the control gate electrode CG. In addition, it is possible to implement lowering of the resistance of the memory gate electrode MG.

Since the capacitive electrode CE1A (the n-type well NW2) is formed under the capacitive electrode CE2A via the capacitive insulating film CZ1A, it is possible to implement the laminated capacitive element CSA which includes the first capacitance constituted by the capacitive electrode CE1A, the capacitive insulating film CZ1A, and the capacitive electrode CE2A and the second capacitance constituted by the capacitive electrode CE2A, the capacitive insulating film CZ2A, and the capacitive electrode CE3A, and it is possible to increase a capacitance value per unit area of the laminated capacitive element CSA.

In addition, the memory cell included in the semiconductor device includes the control gate electrode CG which is formed on the semiconductor substrate 1 via the gate insulating film GIt, the cap layer CP2 which is formed on the control gate electrode CG via the cap insulating film CP1, and the memory gate electrode MG which is formed on the semiconductor substrate 1 via the gate insulating film GIm. The MISFET in the peripheral circuit region B1 includes the gate electrode GEL. The capacitive element in the peripheral circuit region C1 includes the capacitive electrode CE2A which is constituted by the plate-shaped sub-electrode CE21A and the sub-electrode CE22A including the mesa portions (protruding portions) disposed on the sub-electrode CE21A at a predetermined interval and each having the upper surface and the side surfaces, the capacitive insulating film CZ2A which is formed along the upper surface of the sub-electrode CE21A and the upper surface and the side surfaces of the sub-electrode CE22A, and the capacitive electrode CE3A which is formed on the capacitive insulating film CZ2A. Further, the control gate electrode CG, the gate electrode GEL, and the sub-electrode CE21A are formed of the conductor film 5, the cap layer CP2 and the sub-electrode CE22A are formed of the conductor film 7, and the memory gate electrode MG and the capacitive electrode CE3A are formed of the conductor film 9.

Since the side surfaces of the sub-electrode CE22A are set as the capacitor portion of the capacitive element, it is possible to increase a capacitance value per unit area of the capacitive element when seen in a plan view and to reduce a size of the capacitive element.

In addition, since the cap layer CP2 is provided, it is possible to secure the height of the memory gate electrode MG without being affected by the film thickness of the control gate electrode CG. Accordingly, it is possible to prevent a threshold voltage variation of the memory transistor which is generated as the height of the memory gate electrode MG is lowered. Meanwhile, the threshold voltage variation of the memory transistor is generated when the impurity passes through the memory gate electrode MG and is doped into the main surface of the semiconductor substrate 1 in the ion implantation process in the source region or the drain region of the $n^+$ semiconductor region 11a.

Further, since the cap layer CP2 is provided, it is possible to reduce the film thickness of the control gate electrode CG and to reduce the film thickness of the conductor film 5 forming the gate electrode GEL at the same time, and thus, microfabrication of the gate electrode GEL is possible, and it is possible to reduce a size of the peripheral circuit region B1. Note that it is also possible to reduce a size of the peripheral circuit region B2 for the same reason.

That is, it is preferable to set a film thickness of the cap layer CP2 to be equal to the film thickness of the control gate electrode CG or to be thicker than the film thickness of the control gate electrode CG in order to increase the capacitance value of the capacitive element and to obtain the microfabrication of the gate electrode GEL.

In addition, the insulating film 6 is interposed between the sub-electrode CE21A and the protruding portion of the sub-electrode CE22A. Such a configuration can prevent the digging of the sub-electrode CE21A between the protruding portions or etching residue of the conductor film 7, thereby reducing the variation of the capacitance value of the capacitive element.

Second Embodiment

A second embodiment is a modification example of the first embodiment and has a different structure and a different manufacturing method of a laminated capacitive element. The same reference characters will be assigned to the common configuration to the first embodiment, and the description thereof will be omitted. In the second embodiment, a laminated capacitive element CSB is used, and "B" is assigned as the last word of the reference characters of capacitive electrodes and capacitive insulating films. In addition, "C2" is assigned to a peripheral circuit region in which the laminated capacitive element CSB is formed. In the second embodiment, a capacitive electrode CE3B is formed only inside a slit SL2 of a sub-electrode CE22B and is not formed on an upper surface of the sub-electrode CE22B.

Figure 18:
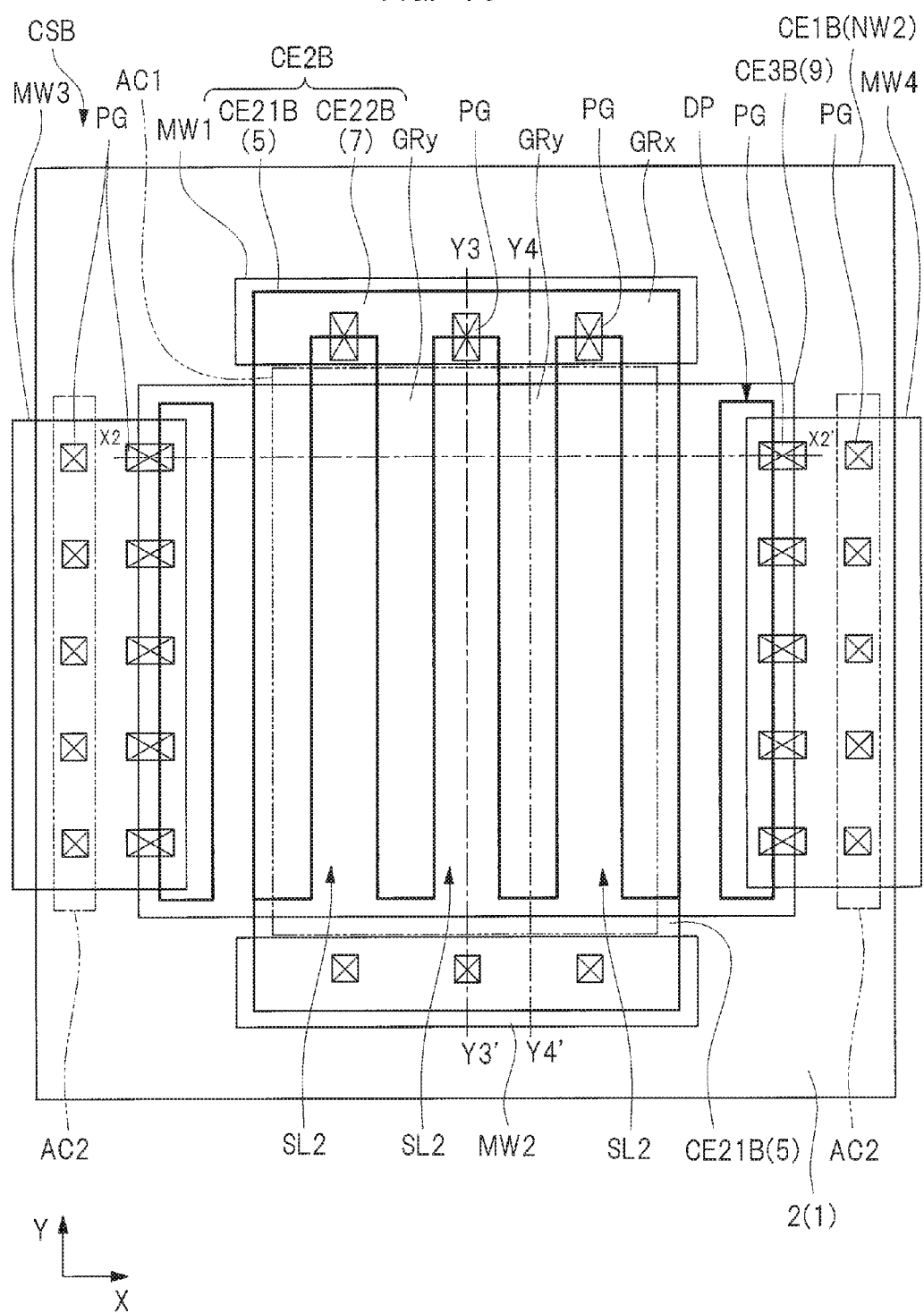
FIG. 18 is a plan view illustrating an essential part of a laminated capacitive element of a second embodiment.
Figure 19:
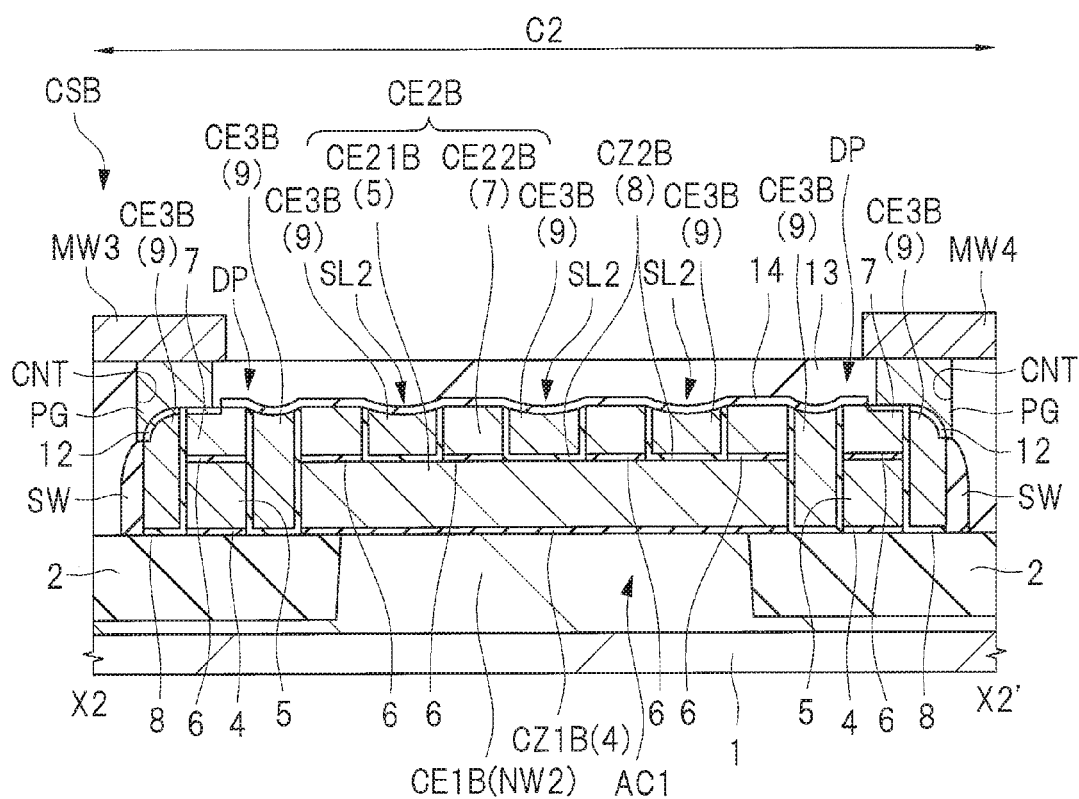
FIG. 19 is a cross-sectional view illustrating an essential part taken along a line X2-X2' of FIG. 18.
Figure 20:
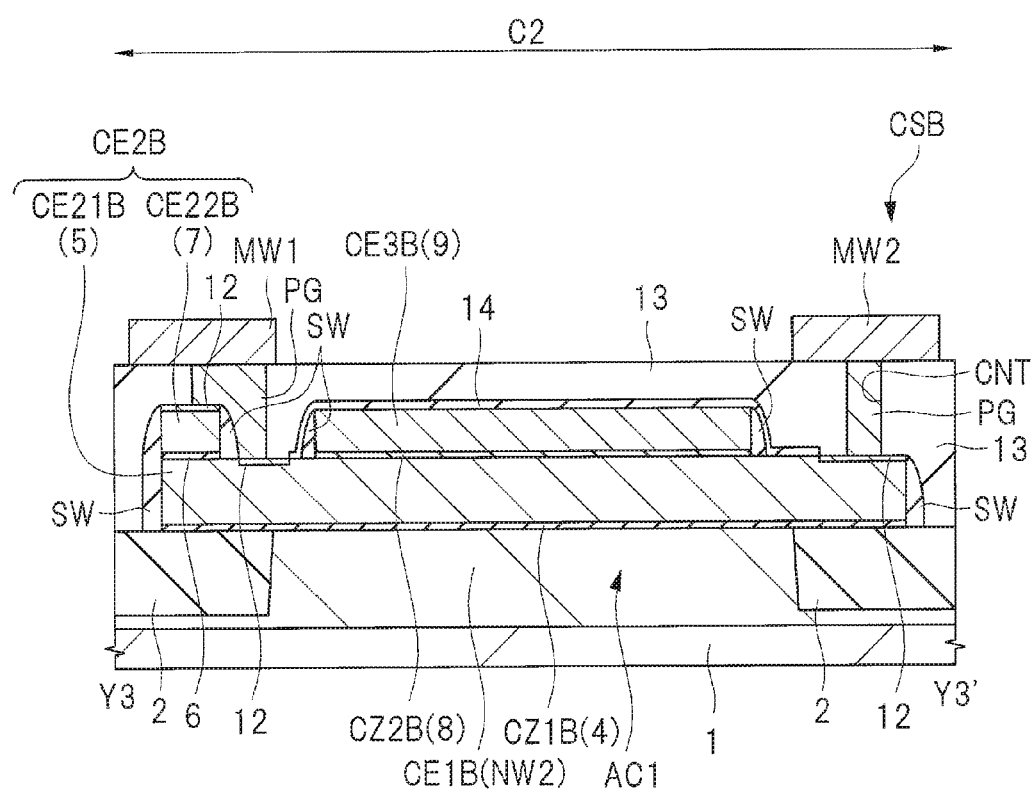
FIG. 20 is a cross-sectional view illustrating an essential part taken along a line Y3-Y3' of FIG. 18.
Figure 21:
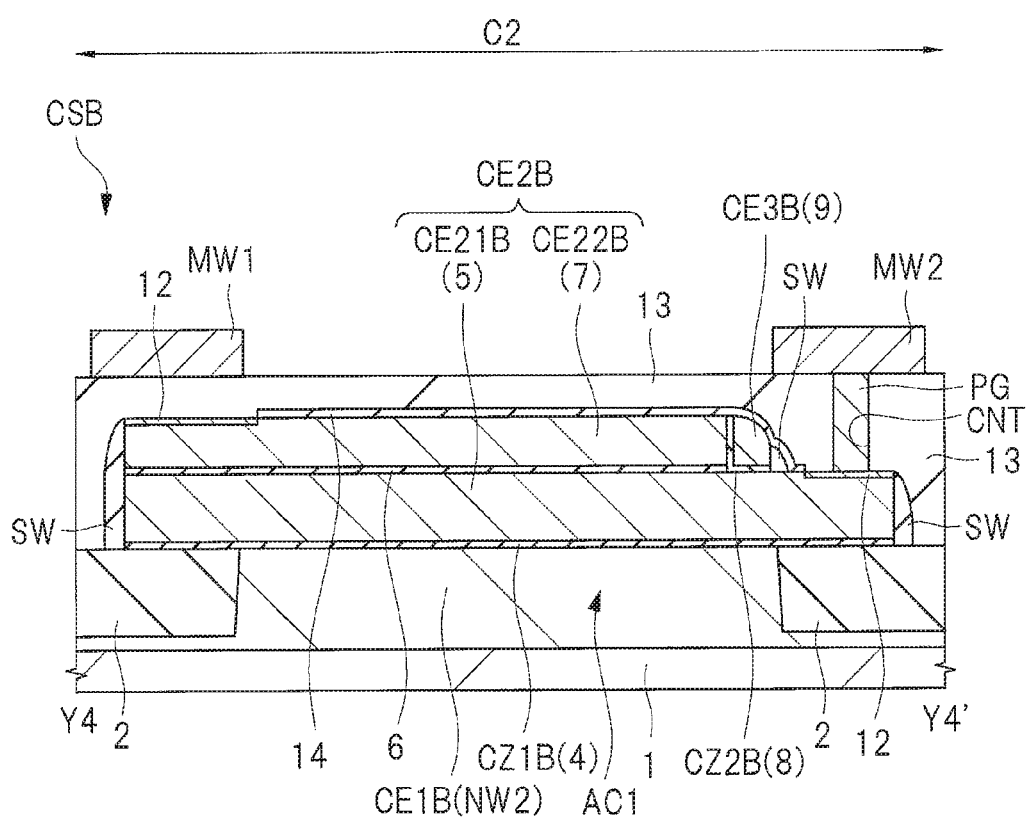
FIG. 21 is a cross-sectional view illustrating an essential part taken along a line Y4-Y4' of FIG. 18.

FIG. 18 is a plan view illustrating an essential part of the laminated capacitive element of the second embodiment, FIG. 19 is a cross-sectional view illustrating an essential part taken along a line X2-X2' of FIG. 18, FIG. 20 is a cross-sectional view illustrating an essential part taken along a line Y3-Y3' of FIG. 18, and FIG. 21 is a cross-sectional view illustrating an essential part taken along a line Y4-Y4' of FIG. 18.

As illustrated in FIG. 18, the laminated capacitive element CSB has a structure in which a rectangular capacitive electrode CE1B having a long side in the longitudinal direction (Y direction), a rectangular capacitive electrode CE2B having a long side in the longitudinal direction, and the rectangular capacitive electrode CE3B having a long side in the lateral direction (X direction) are laminated. The capacitive electrode CE1B and a sub-electrode CE21B of the capacitive electrode CE2B are the same as the capacitive electrode CE1A and the sub-electrode CE21A of the capacitive electrode CE2A according to the first embodiment.

The sub-electrode CE22B of the capacitive electrode CE2B has a tooth shape which is illustrated by a bold line in FIG. 18. Further, dummy patterns DP (illustrated by a bold line) are disposed on both sides of the sub-electrode CE22B in the X direction. As illustrated in FIG. 18, the capacitive electrode CE3B has a rectangular pattern extending in the X direction and overlaps the grids GRy and the dummy patterns DP of the sub-electrode CE22B. However, the capacitive electrode CE3B is not present on the grids GRy and the dummy patterns DP of the sub-electrode CE22B, which will be described later.

The laminated capacitive element CSB includes a first capacitance which is constituted by the capacitive electrode CE1B, a capacitive insulating film CZ1B, and the capacitive electrode CE2B, and a second capacitance which is constituted by the capacitive electrode CE2B, a capacitive insulating film CZ2B, and the capacitive electrode CE3B. Further, the first capacitance and the second capacitance are connected in parallel, as illustrated in FIG. 18.

A description will be given regarding a cross-section structure of the laminated capacitive element CSB with reference to FIG. 19. The capacitive electrode CE3B is formed on the capacitive electrode CE2B which is constituted by the plate-shaped sub-electrode CE21B and the sub-electrode CE22B having mesa portions defined by the slits SL2, via the capacitive insulating film CZ2B. The capacitive electrode CE3B is formed only inside the slit SL2 and does not extend onto the upper surface of the sub-electrode CE22B. That is, the capacitive insulating film CZ2B has end portions on the side surfaces of the sub-electrode CE22B.

The dummy patterns DP, each of which is constituted by a laminated structure body including the conductor film 5, the insulating film 6, and the conductor film 7, are disposed on both ends of the capacitive electrode CE2B, each of the capacitive electrodes CE3B is formed also between the capacitive electrode CE2B and the dummy pattern DP, and the capacitive electrodes CE3B each having a sidewall shape are formed on the sidewalls of the laminated structure body. The capacitive electrodes CE3B inside the slits SL2, the capacitive electrodes CE3B between the capacitive electrodes CE2B and the dummy patterns DP, and the capacitive electrodes CE3B each having the sidewall shape are electrically connected to each other. Further, the capacitive electrode CE3B having the sidewall shape is connected to the metal wire MW3 or MW4 via the plug electrode PG which is formed inside the contact hole CNT of the interlayer insulating film 13. The capacitive electrode CE3B having the sidewall shape has a narrow width, and thus, the contact hole CNT is formed to open each part of the capacitive electrode CE3B having the sidewall shape and the dummy pattern DP, and the plug electrode PG is in contact with the capacitive electrode CE3B having the sidewall shape and the conductor film 7 of the dummy pattern DP.

The metal silicide layer 12 is formed on an upper surface of the conductor film 9 which constitutes the capacitive electrode CE3B having the sidewall shape and being in contact with the plug electrode PG, and on an upper surface of the conductor film 7 of the dummy pattern DP. However, the upper surface of the sub-electrode CE22B of the capacitive electrode CE2B and the upper surface of the capacitive electrode CE3B inside the slit SL2 are covered by an insulating film 14 made of, for example, a silicon oxide film, and the metal silicide layer 12 is not formed. With this structure, it is possible to prevent the capacitive electrode CE3B from being short-circuited from the capacitive electrode CE2B.

FIG. 20 is a cross-sectional view illustrating an essential part taken along a line Y3-Y3' of FIG. 18; however, in the second embodiment, the sub-electrode CE22B has the tooth shape, and the metal wire MW1 is connected to the sub-electrode CE22B and CE21B via the plug electrode PG, but the metal wire MW2 is connected only to the sub-electrode CE21B via the plug electrode PG.

FIG. 21 is a cross-sectional view illustrating an essential part taken along a line Y4-Y4' of FIG. 18. The capacitive electrode CE3B having the sidewall shape is formed on the sidewall of the sub-electrode CE22B via the capacitive insulating film CZ2B. Further, the capacitive electrode CE3B having the sidewall shape extends in the X direction and is coupled with the capacitive electrodes CE3B formed inside the slits SL2 and extending in the Y direction as illustrated in FIG. 18.

Next, a manufacturing process of a semiconductor device according to the second embodiment will be described, and the description will be given only regarding processes which are different from the manufacturing process according to the first embodiment described above, in order to avoid the redundant description.

Figure 22:
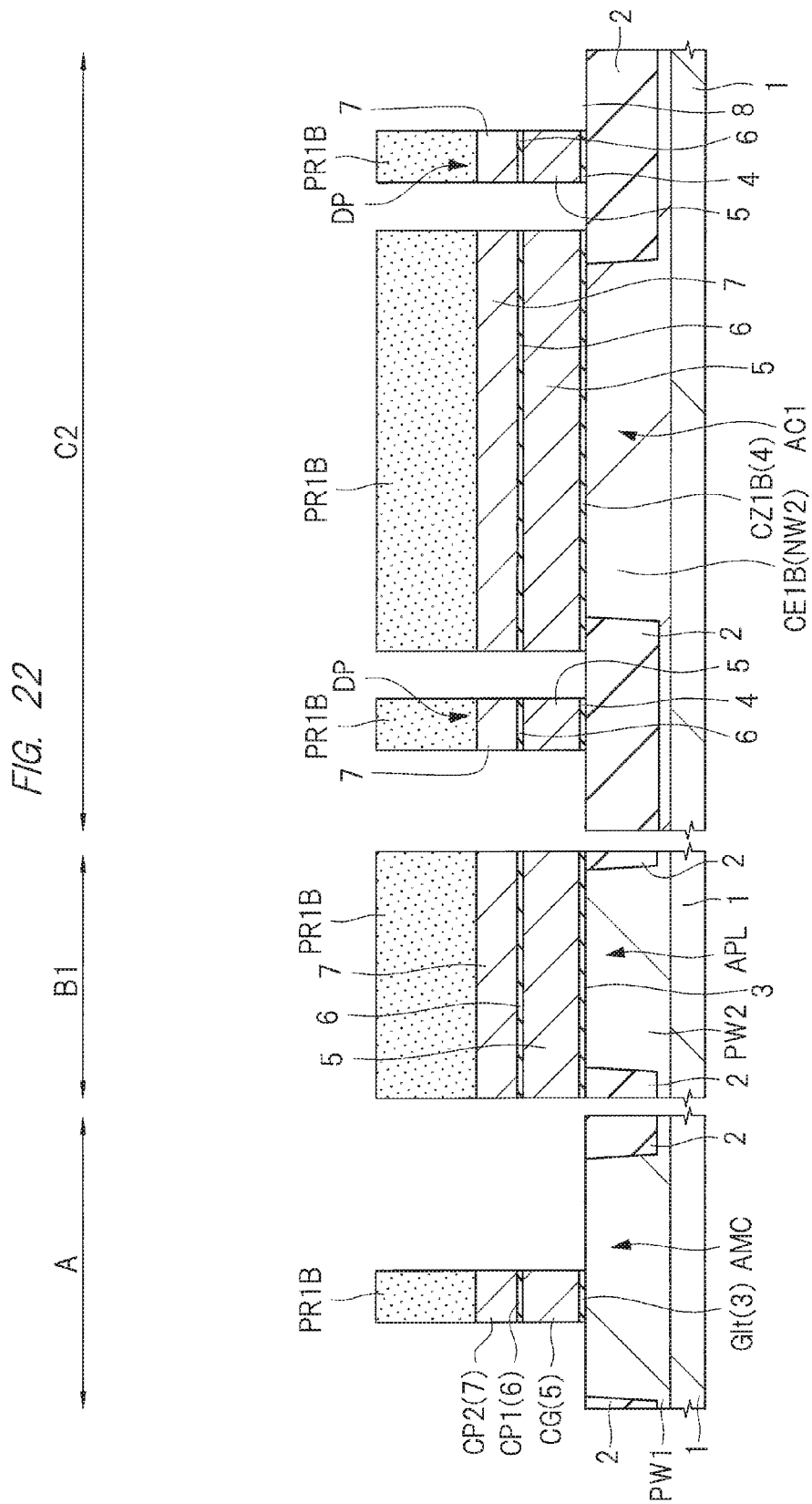
FIG. 22 is a cross-sectional view illustrating an essential part of the semiconductor device during a manufacturing process according to the second embodiment.

FIG. 22 corresponds to the process of processing (patterning) the conductor film 5, the insulating film 6, and the conductor film 7, illustrated in FIG. 9, in the first embodiment. A resist film PR1B is formed on the conductor film 7, and the conductor film 7, the insulating film 6, and the conductor film 5 are patterned using the resist film PR1B as an etching mask by, for example, anisotropic dry etching or the like. The second embodiment is different from the first embodiment in terms that the dummy patterns DP are formed.

Figure 23:
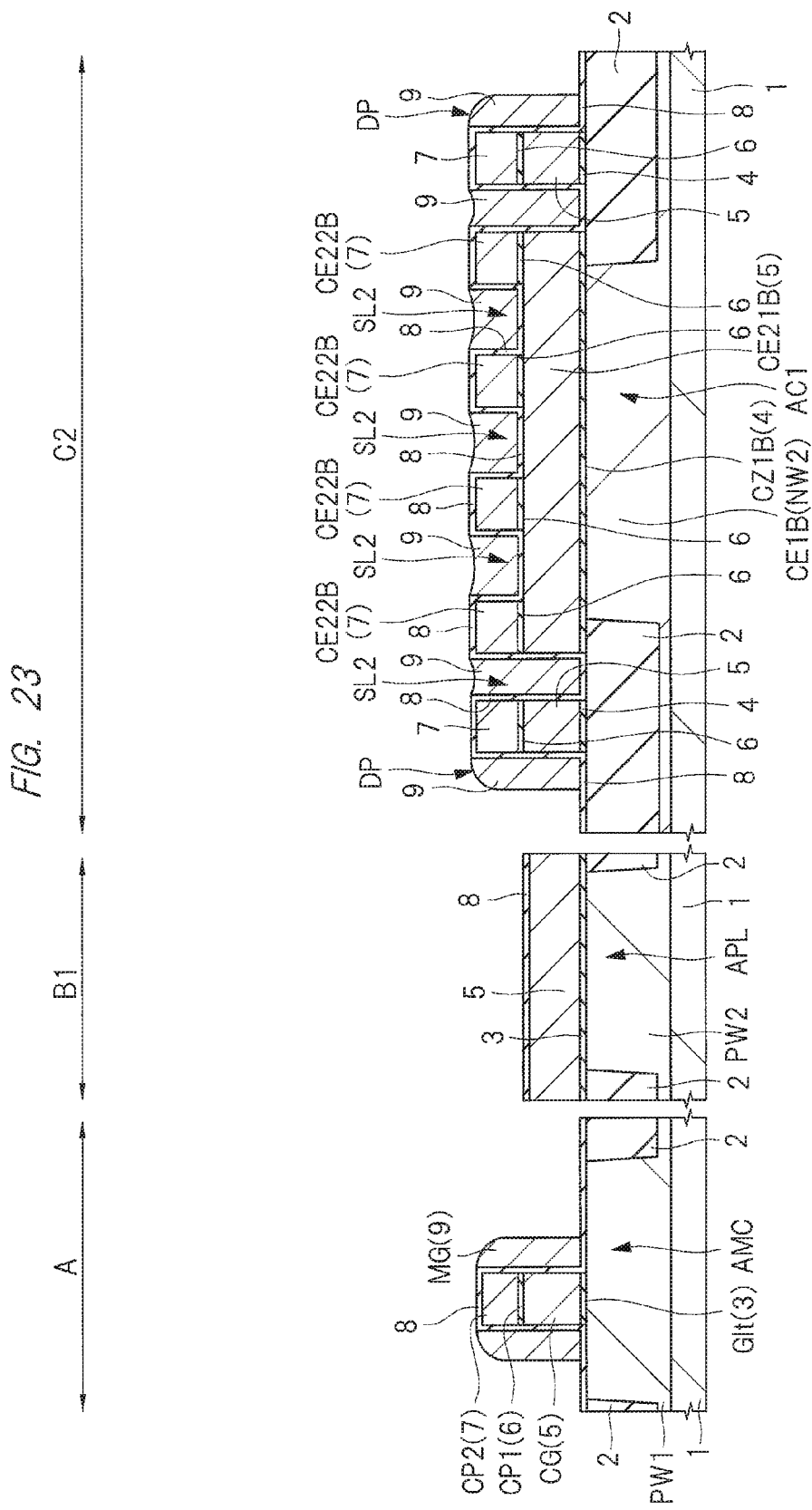
FIG. 23 is a cross-sectional view illustrating an essential part of the semiconductor device during the manufacturing process according to the second embodiment.

FIG. 23 corresponds to the process of forming the memory gate electrode MG, illustrated in FIG. 12, in the first embodiment. A resist film is not formed in the peripheral circuit region C2, and the conductor film 9 is subjected to the anisotropic dry etching. Further, the conductor film 9 remains between the dummy patterns DP and the sub-electrode CE21B, and inside the slits SL2, as illustrated in FIG. 23. Further, the conductor film 9 having a sidewall shape remains on sidewalls of the dummy patterns DP. The conductor film 9 on each upper surface of the dummy patterns DP and the sub-electrodes CE22B is removed, and the insulating film 8 is exposed.

At this time, the conductor films 9 like the sidewall spacer remain on the sidewalls of the capacitive electrode CE2B which protrude from the rectangular pattern of the capacitive electrode CE3B of FIG. 18, similarly to the first embodiment.

Figure 24:
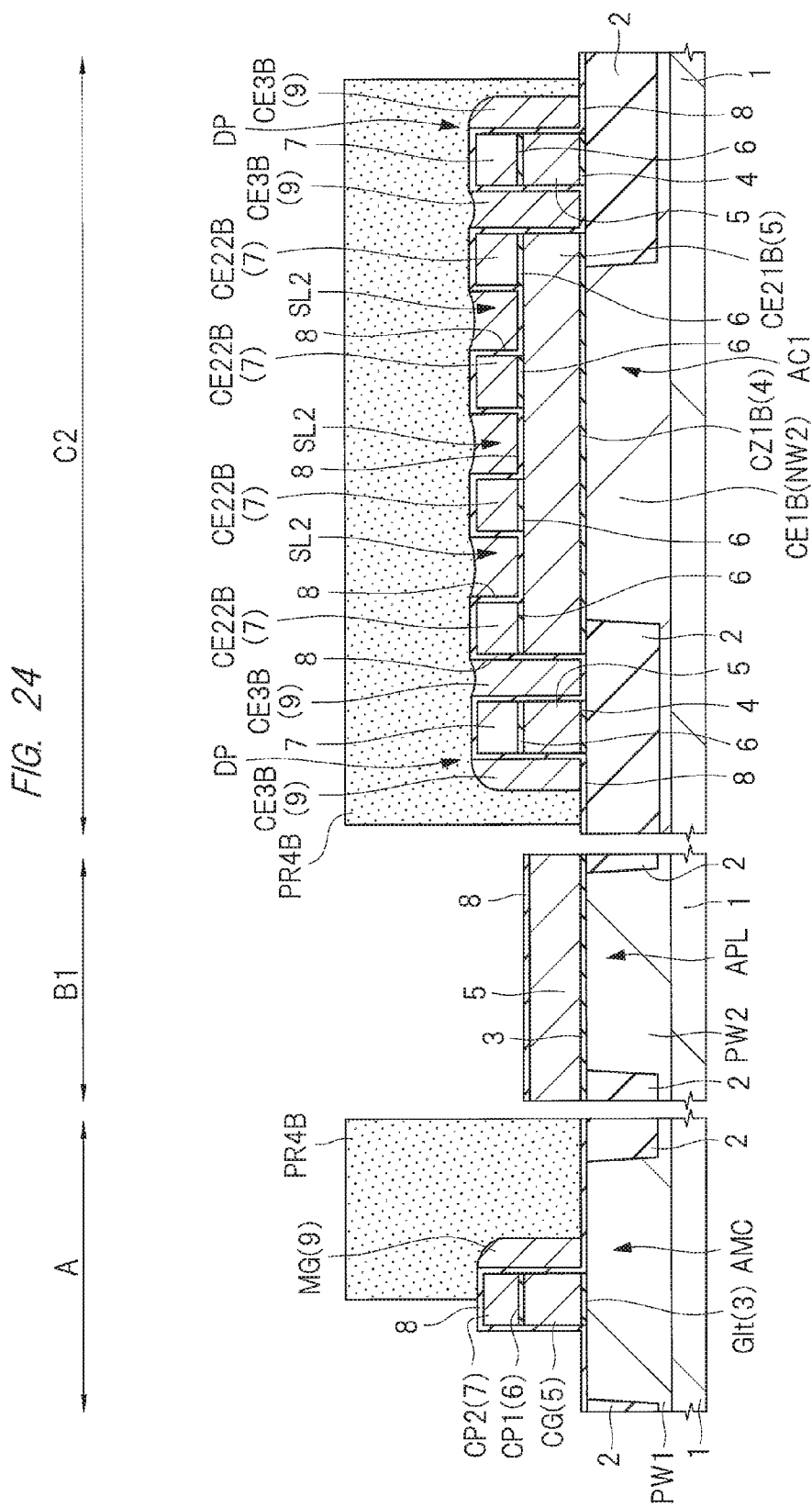
FIG. 24 is a cross-sectional view illustrating an essential part of the semiconductor device during the manufacturing process according to the second embodiment.

FIG. 24 corresponds to the process of removing the spacer SP, illustrated in FIG. 13, in the first embodiment. A resist film PR4B covers the entire capacitive electrode CE3B in the peripheral circuit region C2. A pattern of the resist film PR4B in the peripheral circuit region C2 is a pattern which is slightly larger than the pattern of the capacitive electrode CE3B of FIG. 18, and the above-described conductor films 9 like the sidewall spacer which remain on the sidewalls of the capacitive electrode CE2B are removed using the resist film PR4B as a mask. In this manner, the patterning of the capacitive electrode CE3B is completed.

Figure 25:
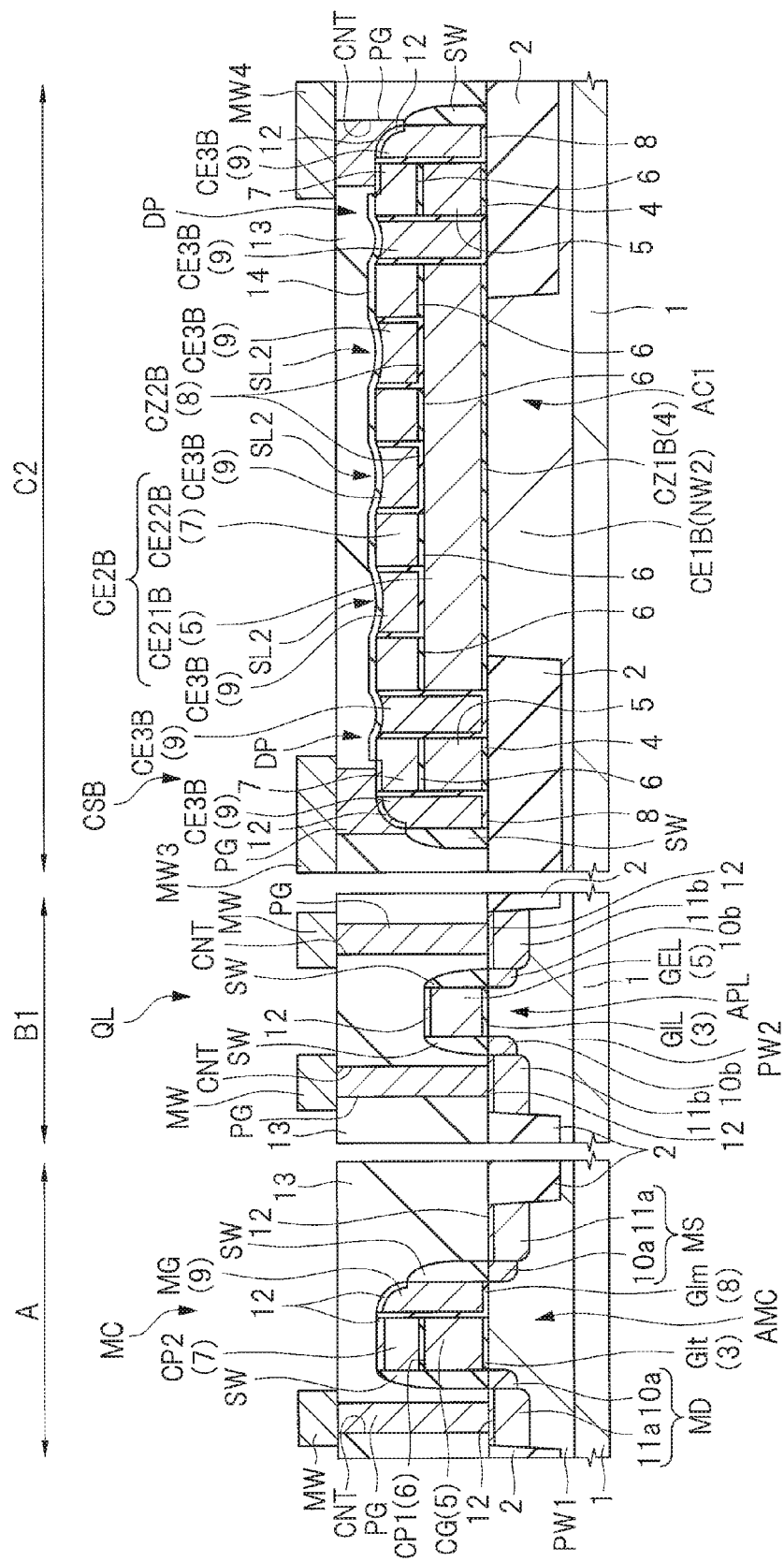
FIG. 25 is a cross-sectional view illustrating an essential part of the semiconductor device during the manufacturing process according to the second embodiment.

FIG. 25 corresponds to the process of forming the metal silicide layer 12, the interlayer insulating film 13, the plug electrode PG, and the metal wires MW, MW3 and MW4, illustrated in FIG. 17, in the first embodiment. In the second embodiment, the capacitive electrode CE3B which covers the upper surface of the sub-electrode CE22B is not present, and thus, the upper surface of the sub-electrode CE22B is exposed when the process of removing the insulating film 8 is performed. Thus, it is vital to cover the upper surfaces of the sub-electrodes CE22B and the upper surfaces of the capacitive electrodes CE3B between the dummy patterns DP and the capacitive electrodes CE2B with the insulating film 14 before forming the metal silicide layer 12.

The interlayer insulating film 13, the plug electrode PG, and the metal wires MW, MW3 and MW4 are formed after forming the metal silicide layer 12.

According to the second embodiment, the capacitive electrode CE3B is not formed on the capacitive electrode CE2B (particularly, the sub-electrode CE22B), and thus, it is possible to provide a shallow depth of the contact hole CNT in which the plug electrode PG to connect the metal wire MW and the metal silicide layer 12 on the surface of the $n^+$ semiconductor region is formed in the memory cell region A or the peripheral circuit region B1. Accordingly, it is possible to provide a small opening diameter of the contact hole CNT, and it is possible to implement higher density in the peripheral circuit region B1, and the reduction in size.

In the foregoing, the invention made by the inventors of the present invention has been concretely described based on the embodiments. However, it is needless to say that the present invention is not limited to the foregoing embodiments and various modifications and alterations can be made within the scope of the present invention.

In addition to the above-description, some of the contents described in the above embodiments are described as follows.

Appendix 1

A method of manufacturing a semiconductor device which includes a memory cell formed in a first region of a main surface of a semiconductor substrate, and a capacitive element formed in a second region, the memory cell including a control gate electrode formed on the main surface of the semiconductor substrate via a first gate insulating film, a cap insulating film on the control gate electrode, a cap layer on the cap insulating film, and a memory gate electrode formed on the main surface of the semiconductor substrate via a second gate insulating film, the second gate insulating film including a charge storage unit, and the capacitive element including a first capacitive electrode constituted by a plate-shaped first sub-electrode with a first pattern formed on the main surface of the semiconductor substrate, and a second sub-electrode with a second pattern formed on the first sub-electrode and having slits, a second capacitive electrode overlapping the first capacitive electrode when seen in a plan view and formed on the first capacitive electrode, and a first capacitive insulating film interposed between the first capacitive electrode and the second capacitive electrode, the method including the steps of:

(a) preparing the semiconductor substrate which has the first region and the second region;

(b) sequentially forming a first conductor film, a first insulating film, and a second conductor film on the main surface of the semiconductor substrate;

(c) forming the control gate electrode, the cap insulating film, and the cap layer in the first region by processing the first conductor film, the first insulating film, and the second conductor film, and forming the first conductor film with the first pattern to form the first sub-electrode, the first insulating film with the first pattern, and the second conductor film in the second region;

(d) processing the second conductor film with the first pattern, and forming the second sub-electrode with the second pattern;

(e) forming a second insulating film to form the second gate insulating film and the first capacitive insulating film on the main surface of the semiconductor substrate, the first sub-electrode, and the second sub-electrode; and (f) forming a third conductor film on the second insulating film, then forming the memory gate electrode on the main surface of the semiconductor substrate via the second insulating film in the first region by performing anisotropic dry etching on the third conductor film, and forming the second capacitive electrode inside each of the slits via the second insulating film in the second region.

Appendix 2

The method of manufacturing the semiconductor device according to Appendix 1, further including the step of:

(g) removing the first insulating film inside each of the slits, between the steps (d) and (e), in which the second insulating film is in contact with the first sub-electrode inside each of the slits.

Appendix 3

The method of manufacturing the semiconductor device according to Appendix 1, in which an upper surface of the second sub-electrode is covered, and the second insulating film is exposed in the step (f).

Appendix 4

The method of manufacturing the semiconductor device according to Appendix 1, in which the anisotropic dry etching is performed in the state of covering the third conductor film on the second sub-electrode with a mask layer, and the second capacitive electrode is processed to continuously extend on the second sub-electrode from an inside of each of the slits in the step (f).

Appendix 5

A method of manufacturing a semiconductor device which includes a memory cell formed in a first region of a main surface of a semiconductor substrate, a capacitive element formed in a second region, and a MISFET formed in a third region, the memory cell including a control gate electrode formed on the main surface of the semiconductor substrate via a first gate insulating film, a cap insulating film on the control gate electrode, a cap layer on the cap insulating film, and a memory gate electrode formed on the main surface of the semiconductor substrate via a second gate insulating film, the second gate insulating film including a charge storage unit, the capacitive element including a first capacitive electrode constituted by a plate-shaped first sub-electrode with a first pattern formed on the main surface of the semiconductor substrate, and a second sub-electrode with a second pattern formed on the first sub-electrode and having slits, a second capacitive electrode overlapping the first capacitive electrode when seen in a plan view and formed on the first capacitive electrode, and a first capacitive insulating film interposed between the first capacitive electrode and the second capacitive electrode, and the MISFET including a gate electrode formed on the main surface of the semiconductor substrate via a third gate insulating film, the method including the steps of:

(a) preparing the semiconductor substrate which has the first region, the second region, and the third region;

(b) sequentially forming a first conductor film, a first insulating film, and a second conductor film on the main surface of the semiconductor substrate;

(c) forming the control gate electrode, the cap insulating film, and the cap layer in the first region by processing the first conductor film, the first insulating film, and the second conductor film in the state of covering the third region with a first mask layer, and forming the first conductor film with the first pattern to form the first sub-electrode, the first insulating film with the first pattern, and the second conductor film in the second region;

(d) forming the second sub-electrode with the second pattern in the second region by processing the second conductor film with the first pattern, and removing the second conductor film and the first insulating film in the third region;

(e) forming the second insulating film to form the first capacitive insulating film on the main surface of the semiconductor substrate, the first sub-electrode, and the second sub-electrode;

(f) forming a third conductor film on the second insulating film, then forming the memory gate electrode on the main surface of the semiconductor substrate via the second insulating film in the first region by performing anisotropic dry etching on the third conductor film, and forming the second capacitive electrode inside each of the slits via the second insulating film in the second region; and (g) processing the first conductor film and forming the gate electrode in the third region.

What is claimed is:

1. A semiconductor device comprising:
a memory cell formed in a first region of a semiconductor substrate; and
a capacitive element formed in a second region of the semiconductor substrate,
wherein the memory cell includes:
a first conductor piece disposed on a main surface of the semiconductor substrate via a first insulator piece;
a second conductor piece disposed on the first conductor piece via a second insulator piece;
a third conductor piece disposed on the main surface of the semiconductor substrate via a third insulator piece, and disposed on side surfaces of the first conductor piece and the second conductor piece via a fourth insulator piece; and a pair of semiconductor regions formed in the main surface of the semiconductor substrate such that the first conductor piece and the third conductor piece are interposed therebetween,
wherein the capacitive element includes:
a fourth conductor piece formed on the main surface of the semiconductor substrate and having an upper surface;
a plurality of mesa-like fifth conductor pieces disposed on the fourth conductor piece via a fifth insulator piece, and each having an upper surface and side surfaces on the fourth conductor piece;
a sixth insulator piece disposed on the upper surface of the fourth conductor piece and on the side surfaces of each of the fifth conductor pieces; and
a sixth conductor piece disposed between the neighboring fifth conductor pieces via the sixth insulator piece,
wherein the first conductor piece and the fourth conductor piece are made of a first conductor film,
wherein the second conductor piece and the fifth conductor pieces are made of a second conductor film, and
wherein the third conductor piece and the sixth conductor piece are made of a third conductor film.

2. The semiconductor device according to claim 1, wherein the sixth conductor piece does not extend on the upper surface of each of the fifth conductor pieces and has an end portion on the side surface of each of the fifth conductor pieces.

3. The semiconductor device according to claim 1, wherein the sixth conductor piece extends on the upper surface of each of the fifth conductor pieces and covers the upper surface of each of the fifth conductor pieces.

4. The semiconductor device according to claim 3, wherein the sixth insulator piece extends on the upper surface of each of the fifth conductor pieces, and the sixth conductor piece covers the upper surface of each of the fifth conductor pieces via the sixth insulator piece.

5. The semiconductor device according to claim 1, wherein the third insulator piece and the sixth insulator piece are made of a first insulating film including a silicon nitride film.

6. The semiconductor device according to claim 1, wherein the second insulator piece and the fifth insulator piece are made of a second insulating film.

7. The semiconductor device according to claim 1, further comprising:
a first silicide layer formed on an upper surface of the second conductor piece; and
a second silicide layer formed on an upper surface of the third conductor piece.

8. The semiconductor device according to claim 1, further comprising:
a second semiconductor region formed in the main surface of the semiconductor substrate in the second region; and
a seventh insulator piece formed on the second semiconductor region,
wherein the fourth conductor piece overlaps the entire second semiconductor region when seen in a plan view.

9. A semiconductor device comprising:
a memory cell formed in a first region of a semiconductor substrate;
a capacitive element formed in a second region of the semiconductor substrate; and
a MISFET formed in a third region of the semiconductor substrate, wherein the memory cell includes:

a first conductor piece disposed on a main surface of the semiconductor substrate via a first insulator piece;

a second conductor piece disposed on the first conductor piece via a second insulator piece;

a third conductor piece disposed on the main surface of the semiconductor substrate via a third insulator piece, and disposed on side surfaces of the first conductor piece and the second conductor piece via a fourth insulator piece; and a pair of first semiconductor regions formed in the main surface of the semiconductor substrate such that the first conductor piece and the third conductor piece are interposed therebetween, wherein the capacitive element includes:

a fourth conductor piece formed on the main surface of the semiconductor substrate and having an upper surface;

a plurality of mesa-like fifth conductor pieces disposed on the fourth conductor piece via a fifth insulator piece, and each having an upper surface and side surfaces on the fourth conductor piece;

a sixth insulator piece disposed on the upper surface of the fourth conductor piece and on the side surfaces of each of the fifth conductor pieces; and a sixth conductor piece disposed between the neighboring fifth conductor pieces via the sixth insulator piece, wherein the MISFET includes:

a seventh conductor piece disposed on the semiconductor substrate via a seventh insulator piece; and a pair of second semiconductor regions formed in the main surface of the semiconductor substrate such that the seventh conductor piece is interposed therebetween, wherein the first conductor piece, the fourth conductor piece, and the seventh conductor piece are made of a first conductor film, wherein the second conductor piece and the fifth conductor piece are made of a second conductor film, wherein the third conductor piece and the sixth conductor piece are made of a third conductor film, and wherein the second insulator piece and the fifth insulator piece are made of a first insulating film.

10. The semiconductor device according to claim 9, wherein each of the first conductor film, the second conductor film, and the third conductor film is made of a silicon film.

11. The semiconductor device according to claim 9, wherein the sixth insulator piece is in contact with the fourth conductor piece between the neighboring fifth conductor pieces.

12. The semiconductor device according to claim 11, wherein the third insulator piece and the sixth insulator piece are made of a second insulating film including a silicon nitride film.

13. The semiconductor device according to claim 12, wherein the second insulating film has a laminated structure including the silicon nitride film and a first silicon oxide film and a second silicon oxide film positioned on and under the silicon nitride film.

14. The semiconductor device according to claim 9, wherein the sixth conductor piece does not extend on the upper surface of each of the fifth conductor pieces and has an end portion on the side surface of each of the fifth conductor pieces.

15. The semiconductor device according to claim 14, further comprising:

an interlayer insulating film covering the memory cell, the capacitive element, and the MISFET;

a metal wire disposed on the interlayer insulating film; and a plug electrode formed inside the interlayer insulating film and electrically connecting the second semiconductor region and the metal wire.

* * * * *